United States Patent
Sanga et al.

(10) Patent No.: US 7,462,884 B2
(45) Date of Patent: Dec. 9, 2008

(54) NITRIDE SEMICONDUCTOR DEVICE

(75) Inventors: Daisuke Sanga, Tokushima (JP);
Hisashi Kasai, Tokushima (JP);
Kazuhiro Miyagi, Tokushima (JP)

(73) Assignee: Nichia Corporation, Anan-Shi Tokushima (JP)

( * ) Notice: Subject to any disclaimer, the term of this patent is extended or adjusted under 35 U.S.C. 154(b) by 93 days.

(21) Appl. No.: 11/589,113

(22) Filed: Oct. 30, 2006

(65) Prior Publication Data

US 2007/0096077 A1 May 3, 2007

(30) Foreign Application Priority Data

Oct. 31, 2005 (JP) .............. 2005-316718
Oct. 24, 2006 (JP) .............. 2006-288278

(51) Int. Cl.
*H01L 29/06* (2006.01)

(52) U.S. Cl. .............. 257/103; 257/79; 257/94; 257/13; 257/E33.033

(58) Field of Classification Search ............ 257/13, 257/79, 103, 183, E33.033, 14, 59, 72, 88, 257/94, 97, 98, 99, E33.008, E33.028, E29.091
See application file for complete search history.

(56) References Cited

U.S. PATENT DOCUMENTS

| | | | |
|---|---|---|---|
| 6,153,894 A * | 11/2000 | Udagawa ............. | 257/96 |
| 6,172,382 B1 | 1/2001 | Nagahama et al. | |
| 6,677,619 B1 | 1/2004 | Nagahama et al. | |
| 2002/0053676 A1 | 5/2002 | Kozaki | |
| 2003/0136970 A1 | 7/2003 | Takeya et al. | |
| 2004/0051107 A1* | 3/2004 | Nagahama et al. ............. | 257/79 |
| 2004/0155248 A1 | 8/2004 | Fukuda et al. | |
| 2005/0040409 A1 | 2/2005 | Takeya et al. | |

FOREIGN PATENT DOCUMENTS

| | | |
|---|---|---|
| EP | 1 017 113 A1 | 7/2000 |
| EP | 1 403 932 A1 | 3/2004 |
| JP | 10-065214 | 3/1998 |
| JP | 11-177175 A | 7/1999 |
| JP | 11-251684 A | 9/1999 |
| JP | 2000-58916 A | 2/2000 |
| JP | 2000-183462 A | 6/2000 |
| JP | 2002-223042 | 9/2002 |
| JP | 2002-335052 | 11/2002 |
| JP | 2003-289176 A | 10/2003 |
| JP | 2004-112002 A | 4/2004 |
| JP | 2005-333159 A | 12/2005 |

* cited by examiner

*Primary Examiner*—Thomas L. Dickey
*Assistant Examiner*—Fazli Erdem
(74) *Attorney, Agent, or Firm*—Birch, Stewart, Kolasch & Birch, LLP

(57) ABSTRACT

A nitride semiconductor device having excellent ESD tolerance, by preventing uneven distribution of the electric current in the p-side nitride semiconductor layer. The p-side nitride semiconductor layer (40) comprises, from the active layer (30) side, (a) a p-side wide band gap layer (12) containing a p-type impurity and (b) a three-layer structure (15) comprising a first p-side nitride semiconductor layer (16), a second p-side nitride semiconductor layer (17), and a third p-side nitride semiconductor layer (18).

17 Claims, 5 Drawing Sheets

NITRIDE SEMICONDUCTOR DEVICE

BACKGROUND OF THE INVENTION

1. Field of the Invention

The present invention relates to a nitride semiconductor device employing a nitride semiconductor (for example, $In_aAl_bGa_{1-a-b}N$, $0 \leq a$, $0 \leq b$, $a+b \leq 1$) used in a light emitting device such as a light emitting diode (LED) and a laser diode (LD), in a photodetector such as a solar cell and an optical sensor, and in an electric device such as a transistor and a power device.

2. Discussion of the Related Art

A nitride semiconductor device is utilized in a light emitting device such as a light emitting diode (LED) and a laser diode (LD), in a photodetector such as a solar cell and an optical sensor, and in an electric device such as a transistor and a power device. Especially, a nitride semiconductor has been widely utilized in an optical device such as a light emitting diode (LED) and a laser diode (LD). A nitride semiconductor device as an optical device generally has a double hetero structure in which an active layer made of a nitride semiconductor such as InGaN is placed between an n-side nitride semiconductor layer and a p-side nitride semiconductor layer each having a wider band gap than that of an active layer.

A variety of stacked layer structures have been considered for the p-side nitride semiconductor layer of the nitride semiconductor device having a double hetero structure. For example, Japanese Laid-Open Patent Application Publication No. 2000-183462 discloses a nitride semiconductor laser device in which at least one layer of a p-type electron confining layer made of Mg doped $Al_dGa_{1-d}N$ ($0<d \leq 1$), a p-type guide layer made of undoped GaN, a multi-layered p-type cladding layer including $Al_fGa_{1-f}N$ ($0<f \leq 1$), and a p-type contact layer made of Mg doped GaN are stacked as a p-side nitride semiconductor layer on a multiquantum well active layer. In addition, a p-type guide layer made of undoped GaN contains Mg of $1 \times 10^{16}$ cm$^{-3}$ to $1 \times 10^{18}$ cm$^{-3}$ diffused from the p-type electron confining layer.

Japanese Laid-Open Patent Application Publication No. H11-251684 discloses a nitride semiconductor laser in which a p-side cap layer made of Mg doped AlGaN, a p-side cladding layer of superlattice structure with alternately stacked layers of GaN and AlGaN, and a p-side contact layer made of Mg doped GaN are stacked as a p-side nitride semiconductor layer on a multiquantum well active layer. In Japanese Laid-Open Patent Application Publication No. H11-251684, in order to reduce the threshold of the laser, the p-side cladding layer of a superlattice structure is initially grown undoped, and then grown so that the content of Mg therein gradually increases with the distance from an active layer. In addition, in the p-side cladding layer having a superlattice structure, the content of Al in the AlGaN layer gradually increases with the distance form the active layer. In addition, Japanese Laid-Open Patent Application Publication No. H11-177175 discloses a nitride semiconductor laser in which a p-side cap layer made of Mg doped AlGaN, a p-side optical guide layer made of undoped GaN, a p-side cladding layer of a superlattice structure with alternately stacked layers of GaN and AlGaN each having different impurity concentration, and a p-side contact layer made of Mg doped GaN are stacked on an active layer.

Japanese Laid-Open Patent Application Publication No. 2003-289176 discloses a GaN-based semiconductor laser in which an undoped InGaN optical waveguide layer, an undoped AlGaN cladding layer, an undoped InGaN layer, a p-type AlGaN electron blocking layer, a p-type AlGaN/GaN superlattice cladding layer, a p-type GaN contact layer are stacked as a p-side nitride semiconductor layer on a multi-quantum well active layer. According to Japanese Laid-Open Patent Application Publication No. 2003-289176, the undoped InGaN optical waveguide layer, the undoped AlGaN cladding layer, and the undoped InGaN layer prevent Mg contained the p-type layers from diffusing into the active layer during crystal growth, aging, or the like.

Japanese Laid-Open Patent Application Publication No. 2004-112002 discloses a nitride semiconductor device in which a p-AlGaN/p-InGaN superlattice p-type layer and a Mg doped GaN/Si doped GaN modulation-doped p-side contact layer are formed as a p-side nitride semiconductor layer on a multiquantum well active layer. According to Japanese Laid-Open Patent Application Publication No. 2004-112002, the Mg doped GaN/Si doped GaN modulation-doped p-side contact layer improves a ESD tolerance (or electrostatic discharge protection) by reducing leakage current, and the p-AlGaN/p-InGaN superlattice p-type layer functions as a cladding layer and performs as a layer for confining light and injecting holes to the active layer. In addition, Japanese Laid-Open Patent Application Publication No. 2004-112002 discloses that the ESD tolerance can be increased if an AlGaN or GaN having a lower impurity concentration is formed between the p-AlGaN/p-InGaN superlattice p-type layer and the Mg doped GaN/Si doped GaN modulation-doped p-side contact layer.

However, in the conventional nitride semiconductor devices, it is needed that the ESD tolerance be further improved. The present inventors arrived at the present invention by considering that, in the nitride semiconductor devices, a decrease in the ESD tolerance occurs because of a local concentration in the electric current caused by a nonuniformity in the electric current flowing in the p-side nitride semiconductor layer, which is caused by the in-plane irregularity of the contact resistance between the p-side nitride semiconductor layer and the electrode, uneven distribution of the Mg concentration in the p-side contact layer, and the material and the shape of the electrode.

That is, although the p-side nitride semiconductor layer in the nitride semiconductor device shows the p-type conductivity through doping with a p-type impurity such as Mg, an activation rate of the p-type impurity in the nitride semiconductor is low so that it is difficult to reduce the resistance thereof. In addition, when the p-side nitride semiconductor layer is formed too thick, it may lead deterioration in the crystallinity and increase in the manufacturing cost so that there is a limitation in increasing the thickness of the layer. Therefore, sufficient in-plane distribution of the electric current in the p-side nitride semiconductor layer has been hardly obtained. Although it is possible to dispose an ohmic electrode with a wide area on the p-side nitride semiconductor layer so as to spread the electric current in the ohmic electrode, the contact resistance between the p-side nitride semiconductor layer and the ohmic electrode tends to be ununiform. In addition, a p-type impurity such as Mg is doped in a part of the p-side nitride semiconductor layer (p-side contact layer), to which the ohmic electrode being in direct contact, with a high concentration so as to establish a good ohmic contact, the p-type impurity concentration and the activation rate in the p-side contact layer may fluctuate in the plane of the p-side contact layer and the local irregularity may occur in the distribution of the electric current that flows in the p-side contact layer. Further, a ununiformity may occur in the electric current that flows in the p-side nitride semiconductor layer, depending on the shape of the ohmic electrode and the position and the shape of a pad electrode disposed on the ohmic electrode. As described above, in the conventional nitride semiconductor devices, an irregularity in the electric current flowing in the p-side nitride semiconductor layer occurs to cause a local concentration in the electric current, and the ESD tolerance is decreased.

SUMMARY OF THE INVENTION

Therefore, an object of the present invention is to provide a nitride semiconductor device having excellent ESD tolerance, by preventing uneven distribution of the electric current in the p-side nitride semiconductor layer of the nitride semiconductor.

To achieve the object, a nitride semiconductor device of the present invention comprises, an active layer made of a nitride semiconductor and placed between an n-side nitride semiconductor layer and a p-side nitride semiconductor layer, an n-side electrode disposed on the n-side nitride semiconductor layer, and a p-side electrode disposed on the p-side nitride semiconductor layer. The p-side nitride semiconductor layer comprises, from the active layer side, (a) a p-side wide band gap layer having a wider band gap than that of the active layer and containing a p-type impurity, and (b) a three-layer structure comprising a first p-side nitride semiconductor layer, a second p-side nitride semiconductor layer and a third p-side nitride semiconductor layer. The third p-side nitride semiconductor layer contains a p-type impurity of $5 \times 10^{20}$ to $2 \times 10^{21}$ $cm^{-3}$. The second p-side nitride semiconductor layer contains a p-type impurity in a lower concentration than that of the third p-side nitride semiconductor layer. The first p-side nitride semiconductor layer has a narrower band gap than that of the second p-side nitride semiconductor layer, and has a lower p-type impurity concentration in the vicinity of the interface with the second p-side nitride semiconductor layer than that of the second p-side nitride semiconductor layer.

According to the nitride semiconductor device of the present invention, the predetermined three-layer structure is provided between the p-side electrode and the p-side wide band gap layer so that the in-plane distribution of the electric current flowing from the p-side electrode to the p-side nitride semiconductor layer can be made uniform and a local concentration of the electric current can be avoided, and the ESD tolerance of the device can be improved.

That is, in the three-layer structure described above, the third p-side nitride semiconductor layer contains a p-type impurity of $5 \times 10^{20}$ to $2 \times 10^{21}$ $cm^{-3}$ which is a relatively high concentration, so that the p-type impurity diffuses toward the second p-side nitride semiconductor layer whose impurity concentration is lower than that in the third p-side nitride semiconductor layer. Therefore, in the second p-side nitride semiconductor layer, a concentration gradient occurs in which the p-type impurity concentration is higher in the third p-side nitride semiconductor layer side and lower in the first p-side nitride semiconductor layer side. In addition, the p-type impurity concentration in the vicinity of the interface between the first p-side nitride semiconductor layer and the second p-side nitride semiconductor layer is further low so that the mobility of holes becomes high due to a less content of the p-type impurity. Moreover, because the first p-side nitride semiconductor layer has a narrower band gap than that of the second p-side nitride semiconductor layer, a pit in the band gap occurs in the first p-side nitride semiconductor layer near the interface with the second p-side nitride semiconductor layer, that eases the holes to accumulate therein and to spread in the in-plane direction (hole accumulation region). On the other hand, in the third p-side nitride semiconductor layer, a p-type impurity is contained in a relatively high concentration of $5 \times 10^{20}$ to $2 \times 10^{21}$ $cm^{-3}$, and a high concentration of the holes exist. In the second p-side nitride semiconductor layer, the p-type impurity concentration gradually increases with the distance from the first p-side nitride semiconductor layer so that the second p-side nitride semiconductor layer as a whole has abundant holes. Therefore, a sufficient amount of holes are supplied toward the hole accumulation region in the first p-side nitride semiconductor layer from the third p-side nitride semiconductor layer and the second p-side nitride semiconductor layer. Thus, the electric current injected from the p-side electrode is diffused in the in-plane direction in the hole accumulation region locating in the vicinity of the interface between the first p-side nitride semiconductor layer and the second p-side nitride semiconductor layer. Consequently, the local concentration of the electric current can be avoided and the ESD tolerance of the device can be improved.

In the above-mentioned three-layer structure, the thickness of the first p-side nitride semiconductor layer is set preferably to 50 Å or more, more preferably to 100 Å or more. With this arrangement, the p-type impurity concentration in the very vicinity of the interface between the first p-side nitride semiconductor layer and the second p-side nitride semiconductor layer can be kept low and high mobility of the holes can be secured. Also, the effect of the bend in the band occurred in the hetero interface between the layer in contact with the underside of the first p-side nitride semiconductor layer and the first p-side nitride semiconductor layer can be canceled out so that the pit in the band can be maintained appropriately, and the holes can be accumulated favorably. On the other hand, when the thickness of the first p-side nitride semiconductor layer is set preferably to 1000 Å or less, the problems such as increasing in Vf (forward voltage) due to increasing in the ohmic resistance and degradation of the crystallinity of the first p-side nitride semiconductor layer can be controlled.

In addition, when the second p-side nitride semiconductor layer is formed preferably to 10 Å or more, the p-type impurity diffused from the third p-side nitride semiconductor layer can be prevented from reaching the first p-side nitride semiconductor layer in large quantity, and the mobility in the first p-side nitride semiconductor layer can be further improved. Also, when the thickness of the second p-side nitride semiconductor layer is set to preferably 200 Å or less, the supply of the holes to the interface with the first p-side nitride semiconductor layer can be increased sufficiently, and the electric current diffusion in the in-plane direction can be enhanced.

Further, when the thickness of the third p-side nitride semiconductor layer is set to preferably—50 Å or more, plenty of holes can be supplied to the hole accumulation region. When the thickness of the third p-side nitride semiconductor layer is set to preferably 1000 Å or less, the crystallinity of the third p-side nitride semiconductor layer can be maintained favorably, even if the p-type impurity concentration is raised.

When the p-type impurity concentration in the vicinity of the interface between the first p-side nitride semiconductor layer and the second p-side nitride semiconductor layer is set to preferably $1 \times 10^{18}$ $cm^{-3}$ or less, the hole mobility in the hole accumulation region in the first p-side nitride semiconductor layer can be further enhanced.

When the average p-type impurity concentration in the second p-side nitride semiconductor layer is set to preferably $1 \times 10^{17}$ to $2 \times 10^{19}$ $cm^{-3}$, the balance of supply of the holes to the hole accumulation region in the first p-side nitride semiconductor layer and the mobility in the hole accumulation region can be improved and the in-plane diffusion of the electric current can be further enhanced.

The hole can be readily injected from the p-side electrode to the active layer, when the first p-side nitride semiconductor layer/second p-side nitride semiconductor layer is formed with $In_xGa_{1-x}N$ ($0<x\leq1$)/$In_yGa_{1-y}N$ ($0\leq y<1$, $y<x$) which is a combination of relatively narrow band gaps. That is, in the present invention, the carrier confinement can be achieved by the p-side wide band gap layer. Therefore, it is advantageous to employ the three-layer structure having a narrower band gap than that of the contact layer (i.e. a layer to which the electrode to be disposed), so as not to hinder the carrier injection to the active layer. Among the nitride semiconductors, the $In_xGa_{1-x}N$ ($0<x\leq1$)/$In_yGa_{1-y}N$ ($0\leq y<1$, $y<x$) is a combination of relatively narrow band gaps so that it is preferable in terms of the hole injection.

The mobility in the hole accumulation region can be increased when the first p-side nitride semiconductor layer/second p-side nitride semiconductor layer is formed with GaN/AlGaN. That is, by forming the first p-side nitride semiconductor layer where the hole accumulation region to be formed with GaN having a good crystallinity, the hole mobility in the hole accumulation region can be improved and the in-plane diffusion of the electric current can be further enhanced.

Moreover, it is preferable to include GaN in the third p-side nitride semiconductor layer, because with this arrangement, even if the p-type impurity concentration in the third p-side nitride semiconductor layer is increased, a good crystallinity thereof can be maintained.

In addition, in the present invention, it is preferable that an intermediate layer having a lower p-type impurity concentration than that of the p-side wide band gap layer is provided between the p-side wide band gap layer and the first p-side nitride semiconductor layer. When the intermediate layer having a lower impurity concentration is formed between the p-side wide band gap layer and the first p-side nitride semiconductor layer, the diffusion of the p-type impurity into the first p-side nitride semiconductor layer can be controlled and the mobility in the hole accumulation region that is formed in the first p-side nitride semiconductor layer can be improved. It is preferable when the intermediate layer is made of GaN or InGaN, the holes can be injected readily to the active layer.

The three-layer structure of the present invention may be stacked repeatedly. With this construction, the electric current diffusion in the in-plane direction in the p-side nitride semiconductor layer can be further enhanced.

In the present specification, when viewed from the active layer, "above" may means a direction toward the p-side nitride semiconductor layer, and "under" may means a direction toward the n-side nitride semiconductor layer. In addition, "undoped" means the state that the impurity is not intentionally doped. For example, in the present invention, it is also called "undoped" even if an impurity diffused from an adjacent nitride semiconductor layer is incorporated, or if a layer is grown without doping with an impurity. When an impurity is incorporated in a layer by diffusion, a gradient in the impurity concentration occurs in many cases.

According to the present invention, uneven distribution of the electric current in the p-side nitride semiconductor layer in the nitride semiconductor device can be controlled and a nitride semiconductor device having excellent ESD tolerance can be provided.

DETAILED DESCRIPTION OF THE PREFERRED EMBODIMENTS

The preferred embodiments of the present invention will be described below with reference to the accompanying drawings.

Here, a light emitting diode employing a nitride semiconductor will be illustrated, the present invention is applicable not only to other light emitting devices such as a semiconductor laser but also to other nitride semiconductor devices. The nitride semiconductor used in the present invention is preferably GaN, AlN, or InN, or a mixed crystal thereof, namely the Group III-V nitride semiconductor ($In_\alpha Al_\beta Ga_{1-\alpha-\beta}N$, $0\leq\alpha$, $0\leq\beta$, $\alpha+\beta\leq1$). The Group III-V nitride semiconductor may be a mixed crystal made by using B as a part or all of the III group element, or by partially replacing N by P, As, or Sb as the Group V element. As a dopant used in the nitride semiconductor, the Group IV elements such as Si, Ge, Sn, S, O, Ti, and Zr may be used as an n-type impurity, while Si, Ge or Sn is preferable, and Si is most preferably used. As the p-type impurity, although it is not specifically limited, Be, Zn, Mn, Cr, Mg, and Ca or the like may be used, and Mg is preferably used. The nitride semiconductor layer of each conductive type is formed by adding each dopant of such acceptors and donors, and the layer of each conductive type which will be described hereinafter is constructed. Even if the nitride semiconductor layer is an undoped layer which is not doped with an impurity, it can be used as the n-type layer.

Embodiment 1

Figure 1:
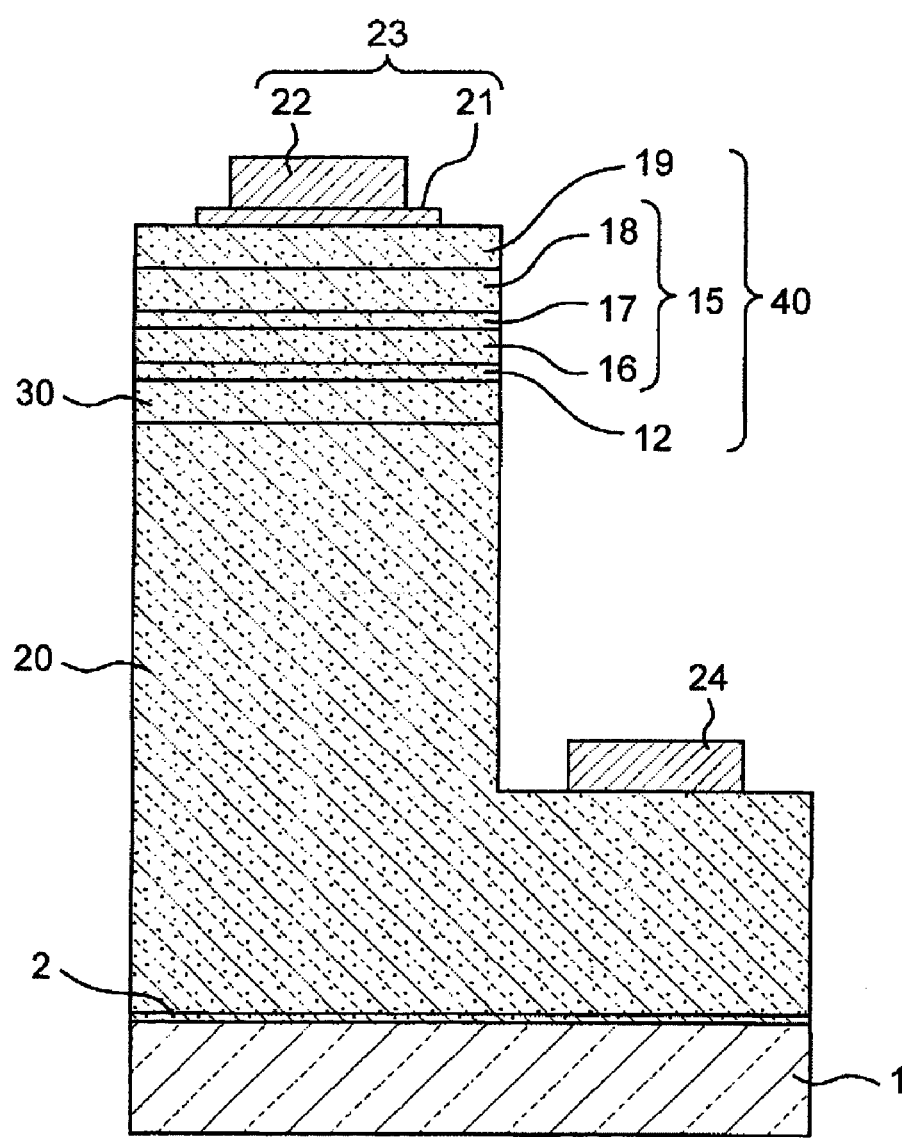
FIG. 1 is a schematic cross-sectional view showing a structure of a nitride semiconductor device according to an example of the present invention.

FIG. 1 is a schematic cross-sectional view showing a nitride semiconductor device (light emitting diode) according to Embodiment 1 of the present invention. A buffer layer 2, an n-side nitride semiconductor layer 20, an active layer 30, a p-side nitride semiconductor layer 40 are stacked on a foreign substrate 1 such as sapphire. Also, as the p-side nitride semiconductor layer 40, a p-side wide band gap layer 12, a first p-side nitride semiconductor layer 16, a second p-side nitride semiconductor layer 17, a third p-side nitride semiconductor layer 18, and a p-side contact layer 19 are stacked in the order. An n-side pad electrode 24 is disposed on a surface of the n-side nitride semiconductor layer 20, which is exposed by removing the p-side nitride semiconductor layer 40 and an active layer 30 partially. A p-side ohmic electrode 21 and the p-side pad electrode 22, which are collectively called a "p-side electrode 23" are disposed on the p-side contact layer 19 in the p-side nitride semiconductor layer 40.

In the nitride semiconductor device shown in FIG. 1, the first p-side nitride semiconductor layer 16, the second p-side nitride semiconductor layer 17, and the third p-side nitride semiconductor layer 18 construct a three-layer structure 15. The third p-side nitride semiconductor layer 18 contains a p-type impurity such as Mg at a relatively high concentration of $5\times10^{20}$ to $2\times10^{21}$ cm$^{-3}$. In addition, the second p-side nitride semiconductor layer 17 is in contact with the underside of the third p-side nitride semiconductor layer 18, and contains a p-type impurity in a lower concentration than that of the third p-side nitride semiconductor layer 18. The first p-side nitride semiconductor layer 16 is in contact with the underside of the second p-side nitride semiconductor layer 17, and has a narrower band gap than that of the second p-side nitride semiconductor layer 17, and the p-type impurity concentration in the vicinity of the interface with the second p-type nitride semiconductor layer 17 is lower than the average p-type impurity concentration in the second nitride semiconductor layer 17.

Figure 2:
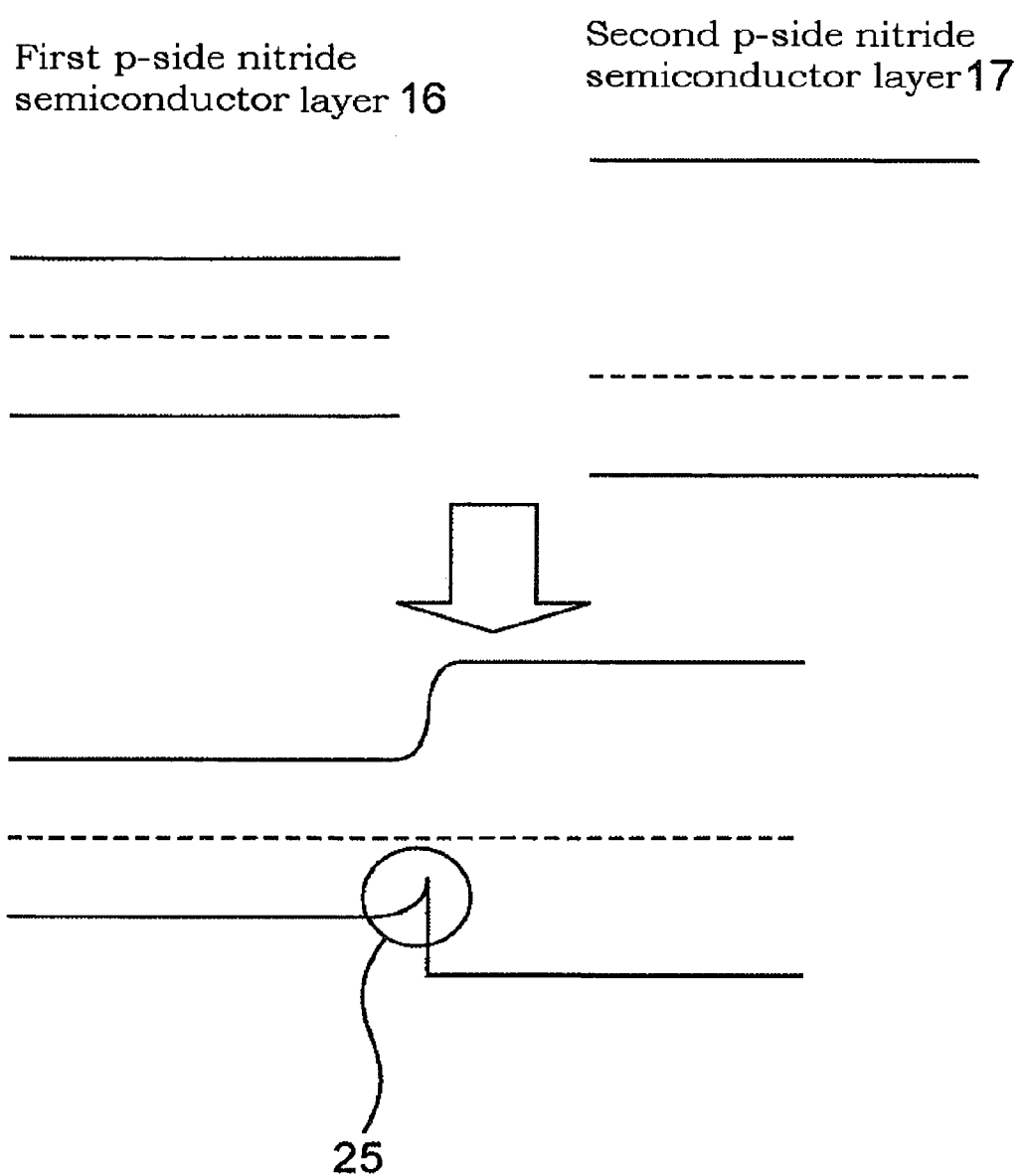
FIG. 2 is a schematic view showing a band structure in the vicinity of the interface between a first p-side nitride semiconductor layer and a second p-side nitride semiconductor layer.

When such three-layer structure 15 is provided between the p-side electrode 23 and the p-side wide band gap layer 12, homogeneous in-plane distribution of the electric current flowing from the p-side electrode 23 to the p-side nitride semiconductor layer 40 can be obtained. Therefore, occurrence of a local concentration of the electric current can be avoided and ESD tolerance of the device can be improved. Moreover, the electric current distribution in the p-side nitride semiconductor layer becomes uniform so that improvement in the optical output can also be expected. That is, in the first p-side nitride semiconductor layer 16, a vicinity of the interface with the second p-side nitride semiconductor layer 17 has the lowest impurity concentration in the three-layer structure so that the hole mobility therein becomes high. On the other hand, the first p-side nitride semiconductor layer 16 has a narrower band gap than that of the second p-side nitride semiconductor layer 17. Therefore, as shown in FIG. 2, a pit in the band 25 is formed in the valence band in the first p-side nitride semiconductor layer 16 side at the interface between the first p-side nitride semiconductor layer 16 and the second p-side nitride semiconductor layer 17. Holes tend to accumulate in the pit in the band 25 of the band so that the pit in the band 25 functions as a hall accumulation region 25 spreading in two dimensions. Therefore, in the first p-side nitride semiconductor layer 16, a vicinity of interface with the second p-side nitride semiconductor layer 17 becomes a region in which the mobility is high and the holes tend to accumulate and spread in two-dimensional direction. Thus, the holes injected from the second p-side nitride semiconductor layer 17 spread in in-plane direction and homogenize the electric current. In other words, a structure similar to that of a HEMT (High Electron Mobility Transistor) is created between the first p-side nitride semiconductor layer 16 and the second p-side nitride semiconductor layer 17, and homogenize in-plane distribution of the electric current.

On the contrary, when a structure similar to a HEMT is formed in the p-side nitride semiconductor layer of the nitride semiconductor device, diffusion of the p-type impurity may be of a problem. That is, in the nitride semiconductors, a p-type impurity such as Mg has a property of easily diffusing during crystal growth or annealing. Therefore, diffusion of a p-type impurity from a layer having a higher p-type impurity concentration to an adjacent layer having a lower p-type impurity concentration occurs. The three-layer structure 15 according to the present invention has an important role in such diffusion of the p-type impurity. That is, in the three-layer structure 15 of the present embodiment, the first p-side nitride semiconductor layer 16 and the second p-side nitride semiconductor layer 17 are grown so that the p-type impurity concentrations may low enough, preferably with a condition that the p-type impurity is not doped in (i.e., undoped), and the third p-side nitride semiconductor layer 18 is grown with a p-type impurity at a relatively high concentration of $5\times10^{20}$ to $2\times10^{21}$ cm$^{-3}$. With this arrangement, diffusion of the p-type impurity occurs from the third p-side nitride semiconductor layer 18 toward the second p-side nitride semiconductor layer 17. Thus, in the second p-side nitride semiconductor layer 17, a concentration gradient is formed, in which the concentration of the p-type impurity is higher in the vicinity of the third p-side nitride semiconductor layer 18 and lower in the vicinity of the first p-side nitride semiconductor layer 16. Further, the p-type impurity also diffuses from the second p-side nitride semiconductor layer 17 to the first p-side nitride semiconductor layer 16. However, the p-type impurity concentration has already been low so that the amount of the p-type impurity getting into the first p-side nitride semiconductor layer 16 is extremely low. Therefore, the p-type impurity concentration in the first p-side nitride semiconductor layer 16 can be kept low enough and hole mobility can be elevated. On the other hand, in the second p-side nitride semiconductor layer 17, the p-type impurity concentration increases from the interface with the first p-side nitride semiconductor layer 16 toward the third p-side nitride semiconductor layer 18. Therefore, comparatively abundant amount of holes exist in the second p-side nitride semiconductor layer 17. In addition, the third p-side nitride semiconductor layer 18 located at an upper side of the second p-side nitride semiconductor layer 17 is doped with a p-type impurity at a relatively high concentration of $5\times10^{20}$ to $2\times10^{21}$ cm$^{-3}$, and holes exist therein in a high concentration. Accordingly, sufficient amount of holes are supplied from the third p-side nitride semiconductor layer 18 and the second p-side nitride semiconductor layer 17 toward the first p-side nitride semiconductor layer 16. As described above, in the first p-side nitride semiconductor layer 16, a vicinity of the interface with the second p-side nitride semiconductor layer 17 (i.e., a region where the hole accumulation region 25 occurs), the mobility becomes high and at the same time, supply of holes from the third p-side nitride semiconductor layer 18 and the second p-side nitride semiconductor layer 17 to the region can be secured.

Also, the three-layer structure 15 is formed closer to the p-side electrode 23 than the p-side wide band gap layer 12 so that the ESD tolerance can be improved effectively. In other words, a surge current flows into from the electrode and damages the device structure at the part where the electric current is concentrated easily. With this reason, basically, it is advantageous when the three-layer structure 15 is closer to the p-side electrode 23. Especially, the p-side wide band gap layer 12 plays important roles in confining the carriers and light in the active layer, and simultaneously, supplying holes to the active layer. Therefore, it is advantageous to form the three-layer structure 15 to a place closer to the p-side electrode 23 than the p-side wide band gap layer 12, and homogenize the electric current distribution, in order to improve the ESD tolerance. When the p-side wide band gap layer 12 is made with a superlattice structure, the luminous efficiency can be improved. However, a superlattice structure is easily damaged by static electricity so that it is especially effective to form the three-layer structure 15 of the present invention at a place closer to the p-side electrode 23 than the p-side wide band gap layer 12.

The three-layer structure 15 according to the present embodiment will now be described in more detail below.

(a) First P-side Nitride Semiconductor Layer 16

The first p-side nitride semiconductor layer 16 is only needed to be a nitride semiconductor having a narrower band gap than that of the second p-side nitride semiconductor layer 17 and various nitride semiconductors such as GaN, InGAN, AlGaN, and InAlGaN can be employed.

Among them, when the first p-side nitride semiconductor layer 16 is $In_xGa_{1-x}N$ ($0<x\leqq1$), the band gap of the entire three-layer structure 15 can be made narrow, because $In_xGa_{1-x}N$ has a comparatively narrow band gap even among the nitride semiconductor. It is preferable to form the band gap of the three-layer structure 15 narrow, because with this, the hole injection to the active layer can be carried out effectively. That is, for example, in the present embodiment, the holes flow into the active layer 30 from the p-side electrode 23 sequentially through the p-side contact layer 19, the three-layer structure 15, and the p-side wide band gap layer 12. From the view point of hole injection, it is preferable that the band gaps are made narrower in this order. This is because when the band gap broadens during this order of the layers, an energy barrier against the hole injection occurs therein. Because the p-side wide band gap layer 12 is needed to confine the holes within the active layer, the band gap of the p-side wide band gap layer must be wide to some degree. On the other hand, the three-layer structure 15 is not subjected to such restriction so that the band gap thereof can be narrowed and thereby effective hole injection can be performed.

In addition, it is preferable to form the first p-side nitride semiconductor layer 16 with GaN. Among the nitride semiconductor, the crystallinity of GaN is especially good. Mobility in a semiconductor depends not only on the impurity concentration but also on the crystallinity of the semiconductor. Therefore, when the first p-side nitride semiconductor layer 16 is formed with GaN having good crystallinity, the hole mobility in the hole accumulation region 25 can be increased and the electric current distribution in in-plane direction can be further homogenized.

In the first p-side nitride semiconductor layer 16, the p-type impurity concentration in the vicinity of the interface with the second p-side nitride semiconductor layer 17 is needed to lower the p-type impurity concentration at least than the average concentration of the p-type impurity in the second p-side nitride semiconductor layer 17, preferably to $1\times10^{18}$ cm$^{-3}$ or less, and more preferably to $5\times10^{17}$ cm$^{-3}$ or less. Here, "a part of the first p-side nitride semiconductor layer 16 in the vicinity of the interface with the second p-side nitride semiconductor layer 17" means a region in the first p-side nitride semiconductor layer 16 having a specific thickness that includes the pit in the band (that is the hole accumulation region) 25 formed at the interface with the second p-side nitride semiconductor layer 17. It means, for example, a region located within a distance of about 100 Å from the interface with the second p-side nitride semiconductor layer 17. When the p-type impurity concentration in this region is reduced, the hole mobility in the hole accumulation region 25 will be elevated so that the electric current distribution in the plane of the p-side nitride semiconductor layer 40 can be homogenized.

In the first p-side nitride semiconductor layer 16, the region opposite from the second p-side nitride semiconductor layer 17 may have somewhat higher p-type impurity concentration. For example, as in the present embodiment, when the p-side wide band gap layer 12 that contains a high concentration of a p-type impurity is in contact with the underside of the first p-side nitride semiconductor layer 16, the p-type impurity diffuses from the p-side wide band gap layer 12 toward the first p-side nitride semiconductor layer 16. Thus, the p-type impurity comes to be contained at a relatively high concentration in the region near the p-side wide band gap layer 12 in the first p-side nitride semiconductor layer 16. However, if the first p-side nitride semiconductor layer 16 has a certain degree of thickness, the p-type impurity diffusing from the underside thereof can be prevented from reaching the region near the interface with the second p-side nitride semiconductor layer 17 (i.e., the region having the hole accumulation region 25), so that the function of electric current diffusion of the three-layer structure 15 will not be obstructed. In this case, the first p-side nitride semiconductor layer 16 comes to have a p-type impurity concentration gradient lower in a portion closer to the second p-side nitride semiconductor layer 17 and higher in the opposite portion near the p-side wide band gap layer 12. It is preferable that when the first p-side nitride semiconductor layer 16 has such concentration distribution of the p-type impurity, the ohmic resistance of the entire first p-side nitride semiconductor layer 16 can be reduced while maintaining high hole mobility in the hole accumulation region 25.

The thickness of the first p-side nitride semiconductor layer 16 is preferably 50 Å or more. Even in the hole diffusion region 25, the in-plane diffusion of the holes tends to occur more easily in a region closer to the interface. Therefore, by adjusting the thickness of the first p-side nitride semiconductor layer 16 to 50 Å or more, even when the p-type impurity diffuses from the layer which is in contact with the underside of the first p-side nitride semiconductor layer 16, the p-type impurity concentration in the very vicinity of the interface between the first p-side nitride semiconductor layer 16 and the second p-side nitride semiconductor layer 17 can be kept low and thus a high hole mobility can be secured. In addition, the influence of the bending of the band occurred in the hetero interface between the layer (here, the p-side wide band gap layer 12) in contact with the underside of the first p-side nitride semiconductor layer 16 and the first p-side nitride semiconductor layer 16 can be canceled out, so that the pit in the band 25 at the interface between the first p-side nitride semiconductor layer 16 and the second p-side nitride semiconductor layer 17 can be maintained in a suitable condition, and thus suitable hole accumulation can be obtained. Here, especially, when the layer in contact with the underside of the first p-side nitride semiconductor layer 16 contains a p-type impurity of $2\times10^{18}$ cm$^{-3}$ or more, it is preferable that the thickness of the first p-side nitride semiconductor layer 16 be 100 Å or more. On the other hand, by adjusting the thickness of the first p-side nitride semiconductor layer to 1000 Å or less, more preferably to 750 Å or less, problems such as elevation of Vf due to large Ohmic resistance or degradation of crystallinity of the first p-side nitride semiconductor layer 16 can be controlled.

(b) Second P-side Nitride Semiconductor Layer 17

The second p-side nitride semiconductor layer 17 is only needed to be a nitride semiconductor having a broader band gap than that of the first p-side nitride semiconductor layer 16 and various nitride semiconductors such as GaN, InGaN, AlGaN, and InAlGaN can be employed. As described above, in view of the hole injection to the active layer, it is preferable that the entire band gap of the three-layer structure 15 is not too wide. Therefore, a narrower band gap is preferable for the second p-side nitride semiconductor layer 17, within the range where the hole accumulation region 25 can be formed effectively. Here, the pit in the band 25 occurs when the band off-set between the first p-side nitride semiconductor layer 16 and the second p-side nitride semiconductor layer 17 is about 0.1 eV.

For example, when the first p-side nitride semiconductor layer 16 is made of $In_xGa_{1-x}N$ ($0<x\leqq1$), the second p-side nitride semiconductor layer 17 is preferably made of $In_yGa_{1-y}N$ ($0\leqq y<1$, $y<x$). Especially, it is further preferable that when the first p-side nitride semiconductor layer 16 is made of InGaN and the second p-side nitride semiconductor layer 17 is made of GaN, the entire band gap of the three-layer structure 15 can become relatively small and moreover, good crystallinity can be obtained for the second p-side nitride semiconductor layer 17 that functions as the supply source of holes. In addition, when the first p-side nitride semiconductor layer 16 is made of GaN, the second p-side nitride semiconductor layer 17 is preferably made of AlGaN.

The second p-side nitride semiconductor layer 17 has a concentration gradient of the p-type impurity in which the p-type impurity concentration is higher near the third p-side nitride semiconductor layer 18 and lower in the opposite side thereof, that is the part closer to the first p-side nitride semiconductor layer 16, due to the diffusion of the p-type impurity from the third p-side nitride semiconductor layer 18. The average concentration of the p-type impurity in the second p-side nitride semiconductor layer 17 is preferably $1 \times 10^{17}$ to $2 \times 10^{19}$ cm$^{-3}$. With this arrangement, a suitable amount of holes supplied from the second p-side nitride semiconductor layer 17 and the third p-side nitride semiconductor layer 18 to the hole accumulation region 25 in the first p-side semiconductor layer 16 can be obtained and the electric current diffusion effect can be improved.

In addition, the thickness of the second p-type nitride semiconductor layer 17 is preferably set to 10 Å and above, more preferably to 20 Å and above, and also preferably set to 200 Å or less, and more preferably to 100 Å or less. When the second p-side nitride semiconductor layer 17 has a thickness described above, carrier supply from the third p-side nitride semiconductor layer 18 to the hole accumulation region 25 in the first p-side nitride semiconductor layer 16 can be maintained sufficiently and at the same time, diffusion of the p-type impurity to the hole accumulation region can be controlled so that the function of electric current diffusion in the three-layer structure 15 can further be improved. That is, while the p-type impurities diffused from the third p-side nitride semiconductor layer 18 will hardly reach the first p-side nitride semiconductor layer 16, an sufficient amount of the holes supplied from the third p-side nitride semiconductor layer 18 will reach the first p-side nitride semiconductor layer 16. Therefore, preferable balance between the supply of holes to the hole accumulation region 25 and the mobility of the hole accumulation region 25 can be obtained and in-plane diffusion of the electric current can further be accelerated.

(c) Third P-side Nitride Semiconductor Layer 18

Various nitride semiconductors such as GaN, InGaN, AlGaN, and InAlGaN can be employed for the third p-side nitride semiconductor layer 18. Especially, it is preferable that when the third p-side nitride semiconductor layer 18 is made of GaN, the p-type impurity concentration in the third p-side nitride semiconductor layer 18 can be increased while maintaining good crystallinity of the third p-side nitride semiconductor layer 18. In addition, the third p-side nitride semiconductor layer 18 can be formed with a material having band gap either narrower or broader than the band gap of the second p-side nitride semiconductor layer 17. For example, in a case where the first p-side nitride semiconductor layer 16 is made of GaN and the second p-side nitride semiconductor layer 17 is made of AlGaN, the third p-side nitride semiconductor layer 18 may be made of GaN.

In addition, the p-type impurity concentration of the third p-side nitride semiconductor layer 18 is preferably $5 \times 10^{20}$ to $2 \times 10^{21}$ cm$^{-3}$. This is because when the p-type impurity concentration of the third p-side nitride semiconductor layer 18 is too high, the crystallinity of the third p-side nitride semiconductor layer 18 degrades and the lifetime etc. decreases. Conversely, when the p-type impurity concentration in the third p-side nitride semiconductor layer 18 is too low, diffusion of the p-type impurity to the second p-side nitride semiconductor layer 17 becomes insufficient and the supply of the holes to the hole accumulation region 25 becomes insufficient.

The thickness of the third p-side nitride semiconductor layer 18 is preferably 50 Å or more. With this arrangement, sufficient amount of holes can be generated in the third p-side nitride semiconductor layer 18. In addition, the thickness of the third p-type nitride semiconductor layer 18 is preferably 5000 Å or less, more preferably 1000 Å or less. With this thickness, the crystallinity of the third p-side nitride semiconductor layer 18 can be maintained favorably even when the p-type impurity concentration is raised. The third p-side nitride semiconductor layer 18 may be formed with a superlattice structure. A superlattice structure is formed by cyclically stacking thin layers each being 100 Å or less, with different compositions. When the third p-side nitride semiconductor layer 18 has a superlattice structure, a preferable chemical composition of the repeated each layer is similar to that of the single-layer. It is advantageous that when the third p-side nitride semiconductor layer 18 is made with a superlattice structure, the crystallinity of the third p-side nitride semiconductor layer 18 can be maintained, even in a condition in which the p-type impurity concentration is raised. In a case where the third p-side nitride semiconductor layer 18 is made with a superlattice structure, a band gap of a layer having a wide band gap among the constituent layers of the third p-side semiconductor layer 18 can be used as the basis for comparison with the band gaps of other layers.

The following combinations are especially preferable for the compositions of the first p-side nitride semiconductor layer 16/the second p-side nitride semiconductor layer 17/the third p-side nitride semiconductor layer 18.

i) $In_xGa_{1-x}N(0<x\leq 1)/In_yGa_{1-y}N(0\leq y<1, y<x)/In_zGa_{1-z}N(0\leq z<1, z<x)$ In this structure, $In_xGa_{1-x}N(0<x\leq 1)/GaN/GaN$ is further preferable. This structure is preferable in that because the band gap of the entire three-layer structure is narrowed, the hole injection to the active layer 30 can be facilitated. This is preferable in the cases where the p-side contact layer 19 is made of GaN or the third p-side nitride semiconductor layer 18 also functions as the p-side contact layer 19. For example, when the emission wavelength of the active layer 30 is of visible light of 380 nm and above, it is advantageous to form the p-side contact layer with GaN that has a good crystallinity, and thus suitable for such cases.

ii) $Al_xGa_{1-x}N(0\leq x<1)/Al_yGa_{1-y}N(0<y\leq 1, y>x)/Al_zGa_{1-z}N(0\leq z\leq 1)$ In this structure, GaN/AlGaN/GaN or GaN/AlGaN/AlGaN is further preferable. Such structures are especially preferable when the p-side contact layer 19 is AlGaN. For example, in a case where the emission wavelength of the active layer 30 is 380 nm or less (i.e. in the ultraviolet region), if GaN is used for the p-side contact layer 19, it will absorb the emission from the active layer. Therefore, in many cases, AlGaN is used for the p-side contact layer 19. In this case, the band gap of the p-side contact layer 19 is broad so that even if the entire band gap of the three-layer structure 15 is comparatively widened, the hole injection is not obstructed. In addition, especially, when the first p-side nitride semiconductor layer 16 is made of GaN, the hole accumulation region 25 can be formed with GaN that has good crystallinity so that it is advantageous for accelerating the in-plane diffusion of the holes.

In the cases described above, the composition within the layers of the first p-side nitride semiconductor layer 16, the second p-side nitride semiconductor layer 17, and the third p-side nitride semiconductor layer 18 are respectively homogenous. However, the compositions of the first p-side nitride semiconductor layer 16, the second p-side nitride semiconductor layer 17, and the third p-side nitride semiconductor layer 18 may vary within each layer as long as the hole accumulation region 25 can be formed and the electric current can be spread within the plane of the p-side nitride semiconductor layer 40.

Each component of the nitride semiconductor device according to the present embodiment will now be described in detail below.

(Substrate 1)

For the substrate 1, any known substrate capable of growing a nitride semiconductor thereon can be used. For example, as a foreign substrate made of a different material than the nitride semiconductor, an insulative substrate such as sapphire or spinel ($MgAl_2O_4$) having C-plane, R-plane or A-plane as a main surface, and an oxide substrate, that lattice matches with the nitride semiconductor, such as SiC (including 6H, 4H, and 3C), ZnS, GaAs, Si, ZnO can be used. Among them, sapphire and spinel are preferable. In addition, a nitride semiconductor substrate such as GaN and AlN can be used. Also, the substrate 1 may finally be removed. A plurality of recesses and protrusions may be formed on the substrate 1 by etching or the like. With this configuration, the crystallinity of the nitride semiconductor layer formed thereon can be made of a good property. Therefore, fluctuation of electric current in the p-side nitride semiconductor layer can be suppressed and a device with excellent ESD tolerance can be obtained.

(Buffer Layer 2)

As the buffer layer 2, it is preferable to use a nitride semiconductor made of, for example, AlGaN (including GaN). The mixed crystal ratio of Al in AlGaN used for the buffer layer 2 is preferably 0.3 or less, and more preferably, 0.2 or less. Also, the buffer layer 2 may finally be removed, or the buffer layer 2 may be omitted. Especially, in the cases where a foreign substrate is used, it is preferable to use a low-temperature grown buffer layer as a layer for crystal nucleus formation and nucleus growth. $Al_xGa_{1-x}N$ ($0 \leq x \leq 1$) grown at a low temperature (200 to 900° C.) is suitable.

(N-side Nitride Semiconductor Layer 20)

As the n-side nitride semiconductor layer 20, it is preferable to form a layer structure comprising the layers such as a contact layer for forming the n-side electrode 24, a layer for supplying electrons to the active layer 30, and a layer for confining the carrier and light within the active layer. Especially, it is preferable that the contact layer, in which the electric current injected from the n-side electrode 24 is diffused across the plane and supplied to the active layer 30, is doped with an n-type impurity in a higher concentration than that in the other regions. In addition, other than such layer-structure for charge-supplying and in-plane diffusion (contact layer and layers in the vicinity thereof), it is preferable to provide other layers such as an intervening layer for moving and/or supplying carriers in the direction of the stacked layers toward the active layer 30, and a cladding layer for confining the carriers within the active layer 30. Moreover, it is also preferable to provide a low impurity concentration layer (either a single layer or a multilayer) containing an n-type impurity in a low concentration than that of the contact layer or an undoped layer. Such structures have a function that allows recovering the deteriorated crystallinity in the contact layer who has a high impurity concentration, and thus the cladding layer and the active layer formed thereon can be made with a good crystallinity. Also, in a case where a low impurity concentration layer is provided adjacent to the high impurity concentration layer such as the contact layer, in-plane distribution of the carriers can be enhanced and the breakdown voltage can also be improved during operation.

In addition, in the n-side nitride semiconductor layer, a low impurity concentration layer may be provided adjacent to a surface of the contact layer that is opposite from the active layer, and a layer formed without doping and having a smaller band gap than that of the low impurity concentration layer may be provided in contact with the low impurity concentration layer. For example, a low impurity concentration layer having a larger band gap than that of the undoped underlayer, and having a lower impurity concentration than that of the n-type contact layer is formed between the undoped underlayer and the n-type contact layer. With this construction, the electric current can be diffused suitably and ESD tolerance can be enhanced. In more detail, there is an impurity concentration difference between the contact layer (a high impurity concentration layer) and the low impurity concentration layer so that the impurity diffuses from the contact layer to the low impurity concentration layer. Thus, when an undoped layer having a small band gap energy is provided adjacent to the low impurity concentration layer, the carrier mobility in the undoped layer having a small band gap energy (especially at the interface of the junction with the low impurity concentration layer) can be made greater. That is, as an impurity diffusion layer, a low impurity concentration layer is interposed between the contact layer having a high impurity concentration and the undoped underlayer, so that at the interface between the undoped layer and the low impurity concentration layer, where the carriers tend to accumulate, the concentration of the impurity that causes decrease in the carrier mobility can be reduced. Thus, the electric current can be diffused suitably in the n-side nitride semiconductor layer and the ESD tolerance of the device can be enhanced.

For example, the underlayer is formed with undoped GaN and AlGaN is formed thereon as a low impurity concentration layer, and a contact layer having a higher impurity concentration than that of the low impurity concentration layer is formed thereon. As a low impurity concentration layer, a layer made of $Al_aGa_{1-a}N$ ($0 \leq a \leq 1$) is preferable. Examples of a combination of an undoped layer having small band gap and a low impurity concentration layer include a stacked structure of AlGaN/AlN, GaN/AlGaN and the like, and the carrier mobility can be enhanced at respective interfaces. In addition, the undoped layer that has a small band gap is not necessarily be the underlayer. For example, an undoped layer having a smaller band gap than that of the low impurity concentration layer may be provided between the underlayer and the low impurity concentration layer. Further, an undoped impurity diffusion prevention region may be provided between the low impurity concentration layer and the undoped layer having a small band gap. With this arrangement, incorporation of the n-type impurity of the low impurity concentration layer into the undoped layer having a small band gap by diffusion and the like can be controlled, and the mobility of the electrons can be kept much higher. The impurity diffusion prevention region is formed so that the band gap thereof is at least larger than that of the undoped layer having a small band gap, and preferably, it is formed so that the band gap thereof is the same as that of the low impurity concentration layer.

Also, when the n-side nitride semiconductor layer is provided as a multilayer, a periodic structure, in which at least two kinds of layers are alternately stacked, is preferable. To be more precise, a periodic structure comprising a nitride semiconductor layer containing In and a layer having a different composition than that is preferable. For example, when a multilayer having a periodic structure repeating $In_xGa_{1-x}N$/ $In_yGa_{1-y}N$ ($0 \leq x < y < 1$) is formed, the crystallinity of the active layer can be improved. This effect is especially significant in the active layer in which a nitride semiconductor layer containing In is used as a well layer. In addition, for a multilayer, other than a periodic structure with different compositions, a composition gradient structure may also be used. Also, in such structures, the impurity concentration may be modulated, or the layer-thickness may be varied. It is advantageous for improving the crystallinity of the active layer when the multilayer is formed with a structure where layers with a thickness of 20 nm or less, more preferably 10 nm or less, are stacked.

In addition, an underlayer may be formed below the contact layer. The underlayer may be included in the driving portion of the device. However, in general, the underlayer is provided as an inactive portion that does not function as the device, so as to grow the device structure with a good crystallinity. It is preferable that the underlayer is grown continuously to the buffer layer 2 at a high temperature, to a thickness of about 50 Å to 0.1 μm (single crystal, high temperature grown layer). In addition, a method known as ELO (Epitaxial Lateral Overgrowth) may further be applied. That is, a plurality of portions for selective growth, where the nitride semiconductor is selectively or preferentially grown, are formed with island shape on the substrate 1 or the underlayer. For example, periodical protrusions with island shape are formed on the underlayer or the substrate, or a mask with periodic openings. Then, the nitride semiconductors grown laterally from each selected growth portion are connected to obtain a nitride semiconductor layer having fewer dislocations. When the device structure is formed thereon, the lifetime of the device can be improved.

(Active Layer 30)

The active layer 30 preferably has a quantum well structure. Examples of a quantum well structure include a single quantum well structure having one well layer and a multi-quantum well structure in which a plurality of well layers are stacked via barrier layers. In either case, the well layer becomes the light emitting layer. A nitride semiconductor that contains In is preferable not only for the well layer of multi quantum well structure but also for the light emitting layer. When the nitride semiconductor containing In is used for the light emitting layer, a preferable luminous efficiency in the region from ultraviolet through visible light (red light) can be obtained. Especially, when an InGaN layer is used for the light emitting layer, it is preferable because a desired emitting wavelength can be obtained by varying the mixed crystal ratio of In. Besides, by using a nitride semiconductor having a wider band gap than that of InGaN such as GaN and AlGaN for the light emitting layer, a light emitting device whose emission is in ultraviolet region may be formed.

In addition, in the active layer 30 having a multi quantum well structure, a barrier layer has a wider band gap than that of the well layer. For example, it is preferable to provide InGaN, GaN, or AlGaN as a barrier layer. The thickness of the wall layer and the barrier layer is desirably 30 nm or less, preferably 20 nm or less. Especially, a thinner wall layer is preferable so that the thickness of 10 nm or less is preferable. With this arrangement, the active layer with excellent quantum efficiency can be obtained. Also, an n-type impurity or a p-type impurity may be doped in the well layer and/or barrier layer. One or more barrier layers may be formed between the well layers. When comparing the size of the band gap of the active layer 30 having a multiquantum well structure with other layers, the band gap of a well layer in the active layer is considered.

(P-side Wide Band Gap Layer 12)

The p-side wide band gap layer 12 has the function of supplying carriers (holes) to the active layer 30 and confining light within the active layer 30. The p-side wide band gap layer 12 is made of a multilayer or a single layer. In either case, the thickness of the p-side wide band gap layer 12 is preferably thicker than that of the second p-side nitride semiconductor layer 17 in order to achieve function of supplying the carriers to the active layer 30 and/or confining light within the active layer 30. In addition, the p-side wide band gap layer 12 is needed to have enough p-type impurity concentration for supplying the holes to the active layer 30, so that the p-type impurity concentration in the p-side wide band gap layer 12 is preferably higher than that in the second p-side nitride semiconductor layer 17. More specifically, the p-side wide band gap layer 12 preferably contains a p-type impurity from $2 \times 10^{18}$ to $2 \times 10^{21}$ cm$^{-3}$, more preferably $5 \times 10^{18}$ to $5 \times 10^{20}$ cm$^{-3}$ in order to supply enough carriers to the active layer 30. In addition, when the p-side wide band gap layer 12 is a multilayer, the average p-type impurity concentration of the p-side wide band gap layer 12 as a whole may be considered. When comparing the p-type impurity concentration in the multilayer p-side wide band gap layer 12 with other layers, in a similar way, the average p-type impurity concentration may be considered. Here, the average concentration of the p-type wide band gap multilayer 12 can be obtained by multiplying impurity concentration of each layer by the ratio of the thickness of each layer to the total thickness and then adding them.

(a) P-side Wide Band Gap Multilayer 12

First, a case in which the p-side wide band gap layer 12 is formed with a multilayer structure (superlattice structure) will be described below. In the following, a p-side wide band gap layer made of a multilayer will be termed a "p-side wide band gap multilayer". When the p-side wide band gap multilayer 12 has a structure in which layers having different band gaps are alternately stacked, the band gap of a layer having the largest band gap in the p-side wide band gap multilayer is considered when comparing the band gap of the p-side wide band gap multilayer 12 with other layers. Examples of the multilayer constructing the p-side wide band gap multilayer include stacked layers of a first nitride semiconductor layer containing Al and a second nitride semiconductor layer having different composition than that of the first nitride semiconductor layer, in which a p-type impurity is contained in at least one kind of layers of the first nitride semiconductor layer and the second nitride semiconductor layer. In the following, the difference in the composition between the first semiconductor layer and the second nitride semiconductor layer is described as the difference in the band gaps thereof. For the p-side wide band gap multilayer 12, stacked layers of the first nitride semiconductor layer having a wider band gap and the second nitride semiconductor layer having a narrower band gap than that of the first nitride semiconductor layer. A p-type impurity is contained in at least one kind of the first nitride semiconductor layer and the second nitride semiconductor layer, with the p-type impurity concentration may either be the same or different.

The thicknesses of the first and the second nitride semiconductor layers constructing the multilayer in the p-side wide band gap multilayer 12 is preferably adjusted to 100 angstroms or less, more preferably 70 angstroms or less, most preferably 10 to 40 angstroms, and the thicknesses of the first nitride semiconductor layer and the second nitride semiconductor layer may either be the same or different. When the thicknesses of each layer in the multilayer structure are set in the range described above, those thicknesses will be below the elastic critical thickness of the nitride semiconductor, and the nitride semiconductor having a better crystallinity can be grown compared with the cases in which the nitride semiconductor is grown to a larger thickness, and also, the crystallinity of the nitride semiconductor layer can be improved. With this arrangement, when a p-type impurity is added, a p-layer with a high carrier concentration and a low resistivity can be obtained and the Vf and the threshold of the device can be reduced. A multilayer may be formed by stacking a pair of two layers having such thicknesses for multiple times. Also, one more layer of one kind of the layer compared to the other layer may be stacked. For example, layers may be stacked started with the first nitride semiconductor layer and ended with the first nitride semiconductor layer. The entire thickness of the p-side wide band gap multilayer 12 may be adjusted by the thickness of each layer of the first and second semiconductor layers and the number of the layers to be stacked. The total thickness of the p-side wide band gap multilayer 12 is not specifically limited, however, it is preferable that the total thickness thereof is 2000 angstroms or less, preferably 1000 angstroms or less, and more preferably 500 angstrom or less. When the total thickness is in this range, the emission output can be increased and Vf can be decreased.

The first nitride semiconductor layer is preferably grown as a nitride semiconductor including at least Al, preferably $Al_nGa_{1-n}N$ ($0<n\leq1$), and the second nitride semiconductor layer is preferably grown as a nitride semiconductor of binary mixed crystal or of ternary mixed crystal such as $Al_pGa_{1-p}N$ ($0\leq p<1$, n>p) and $In_rGa_{1-r}N$ ($0\leq r\leq1$). Especially, the combination of the first nitride semiconductor layer of $Al_nGa_{1-n}N$ ($0<n\leq1$) and the second nitride semiconductor of $In_rGa_{1-r}N$ ($0\leq r\leq1$) is preferable. The combination of the first nitride semiconductor layer of GaN and the second nitride semiconductor of $In_rGa_{1-r}N$ ($0<r\leq1$) is also preferable. When the p-side wide band gap layer 12 is a multilayer comprising the first nitride semiconductor layer and the second nitride semiconductor layer as described above, an "Al composition ratio" of a multilayer represents an average value. In addition, when the p-side wide band gap layer 12 has a superlattice structure, the crystallinity can be improved and the resistivity can be reduced, so that Vf can be lowered.

The p-type impurity concentration in the p-side wide band gap multilayer 12 will be described below. The p-type impurity concentration in the first nitride semiconductor layer and the second nitride semiconductor layer constructing the p-side wide band gap multilayer may either be different or the same. First, a case with different concentrations will be described. When the p-type impurity concentrations in the first nitride semiconductor layer and the second nitride semiconductor layer in the p-side wide band gap multilayer 12 are different, i.e., one type of layer is made with a higher p-type impurity concentration and the another type of layer is made with a lower p-type impurity concentration, for example, the p-type impurity concentration may be set higher in the first semiconductor layer having a larger band gap energy and lower in the second nitride semiconductor layer having a smaller band gap energy. Vice versa, the p-type impurity concentration may be set higher in the first nitride semiconductor layer having a larger band gap energy and higher in the p-type impurity concentration in the second nitride semiconductor layer having smaller band gap energy. As described above, when the first nitride semiconductor layer and the second nitride semiconductor layer are formed with different p-type impurity concentrations, the threshold voltage, Vf or the like, can be reduced. This is considered that when both the layers of a layer of a high carrier concentration having a high impurity concentration as well as a layer of high mobility having a low impurity are provided in the p-side wide band gap multilayer, the carriers in a layer of higher carrier concentration can be transferred in the layer of higher mobility. Therefore, the resistivity of the multilayer can be lowered and the threshold voltage and Vf or the like can be reduced, as described above. When the first nitride semiconductor layer and the second nitride semiconductor layer are formed with different p-type impurity concentrations as described above, the layer with a lower impurity concentration is preferably made undoped, and with this arrangement, the threshold voltage, Vf (forward voltage), or the like can be further reduced.

When the p-type impurity concentration in the first nitride semiconductor layer and the second nitride semiconductor layer are different, the p-type impurity concentration in the first nitride semiconductor layer is preferably adjusted so that the average p-type impurity concentration of the entire multilayer is lower than that in the p-side contact layer 19. Specifically, the p-type impurity concentration in the first nitride semiconductor layer is preferably adjusted in the range between $2\times10^{18}$ and $2\times10^{21}$ $cm^{-3}$, more preferably in the range between $5\times10^{18}/cm^3$ and $5\times10^{20}/cm^3$. When the p-type impurity concentration in the first nitride semiconductor layer is $2\times10^{18}/cm^3$ or more, there are tendencies that the carrier injection efficiency to the active layer improves, the emission output increases, and the Vf decreases. In addition, when the p-type impurity concentration in the first nitride semiconductor layer is $2\times10^{21}/cm^3$ or less, the crystallinity tends to improve.

On the other hand, in the cases where the p-type impurity concentration in the first nitride semiconductor layer and the second nitride semiconductor layer is different, it is preferable to adjust the p-type impurity concentration in the second nitride semiconductor layer lower than that in the first nitride semiconductor layer, and the p-type impurity in the entire p-side wide band gap layer 12 lower than the impurity concentration in the p-side contact layer 19. The p-type impurity concentration in the second nitride semiconductor layer is not specifically limited. However, the p-type impurity concentration of $1/10$ or less of that in the first nitride semiconductor layer is preferable. More preferably, when the second nitride semiconductor layer is of undoped, a layer of the highest mobility can be obtained.

However, because the thickness of the second nitride semiconductor layer is thin, the p-type impurity diffuses in some degree from the first nitride semiconductor layer side. So that in the cases where the mobility in the second nitride semiconductor layer is considered, the amount of the p-type impurity diffusing into the second nitride semiconductor layer is preferably $1\times10^{20}/cm^3$ or less. It is similar in the cases where the first nitride semiconductor layer having a wider band gap is doped with a less amount of the p-type impurity, and the second nitride semiconductor layer having a narrower band gap is doped with a greater amount of p-type impurity.

The p-type impurity concentration in a case where the p-type impurity concentration in the first nitride semiconductor layer and the second nitride semiconductor layer are the same will be illustrated below. In this case, it is preferable to adjust the p-type impurity concentrations in the first nitride semiconductor layer and the second nitride semiconductor layer lower than that in the p-side contact layer 19. Specifically, it is an amount in a range similar to that of the impurity concentration doped into the first nitride semiconductor layer in a case where the p-type impurity concentration in the first and the second nitride semiconductor layers differs. When the p-type impurity is doped so as to be the same in the first and second nitride semiconductor layers, the crystallinity tends to become to some degree inferior, compared to the cases where the p-type impurity concentration differs as described above. However, it is preferable in that the p-side wide band gap layer 12 with a higher carrier concentration becomes easier to form and output can be improved.

Also, in the cases where the nitride semiconductor layers (first and second nitride semiconductor layer) that are adjacent each other and constituting the p-side wide band gap multilayer 12 have different p-type impurity concentration, the nitride semiconductor layer to be doped with the p-type impurity in a high concentration is desirably adjusted so that the impurity concentration in the vicinity of the center of the nitride semiconductor layer to be larger and vicinities of both ends to be smaller (preferably undoped), in order to reduce the resistivity thereof.

(b) P-side Wide Band Gap Single Layer 12

Illustrated below is a case where a p-side wide band gap layer 12 is a single layer made of $Al_bGa_{1-b}N$ ($0 \leq b \leq 1$) or $In_cGa_{1-c}N$ ($0 \leq c < 1$) that includes a p-type impurity. Hereinafter, a p-side wide band gap layer 12 made of a single layer will be termed a "p-side wide band gap single layer". In the cases where the p-side wide band gap single layer does not include Al, the optical output decreases to some extent compared with the cases where Al is included. However, the ESD tolerance can be almost as preferable as in the cases where Al is included.

The thickness of the p-side wide band gap single layer 12 is not specifically limited, however, in order to improve the optical output and to decrease Vf, it is preferable to adjust the thickness thereof to 2000 angstroms or less, more preferably to 1000 angstroms or less, further preferably to 500 to 100 angstroms.

The p-type impurity concentration in the p-side wide band gap single layer 12 is preferably adjusted within the range between $2 \times 10^{18}/cm^3$ and $2 \times 10^{21}/cm^3$, more preferably in the range between $5 \times 10^{18}/cm^3$ and $5 \times 10^{20}/cm^3$. It is preferable when the impurity concentration is adjusted in the range described above, a preferable p-type layer can be formed and optical output can be improved. In addition, although the crystallinity of the p-side wide band gap single layer 12 will be rather inferior to that of the above-described p-side wide band gap layer of multilayer structure, the overall property of the layer will be almost the same. Moreover, the p-side wide band gap single layer 12 is a single layer so that the manufacturing process can be simplified and thus suitable for mass production.

(P-side Contact Layer 19)

As the p-side contact layer 19, the composition is not specifically restricted, and for example, GaN, AlGaN having the Al ratio of 0.2 or less, and InGaN having the In ratio of 0.2 or less can be used. More preferably, when GaN is used, preferable ohmic contact with the p-side ohmic electrode 21 becomes easier to obtain. The p-side ohmic electrode 21 used in the present invention is not specifically limited and a known electrode using ITO (Indium Tin Oxide) and the like, or the electrodes described in the examples can be used.

The p-side contact layer 19 may be omitted, and in that case, the third p-side nitride semiconductor layer 18 can also be used as the p-side contact layer. The p-side contact layer 19 may be made with a two-layer structure having different p-type impurity concentrations. That is, a high-concentration p-side contact layer doped with a p-type impurity in a relatively high concentration is provided near the p-side ohmic electrode 21 and a low-concentration p-side contact layer doped with a p-type impurity in a relatively low concentration is provided near the three-layer structure 15. For example, the high-concentration p-side contact layer is made of GaN doped with a p-type impurity in $1 \times 10^{20}$ cm$^{-3}$ or more, preferably $1 \times 10^{21}$ cm$^{-3}$ or more (e.g. $1.5 \times 10^{21}$ cm$^{-3}$), and the low-concentration p-side contact layer is made of GaN doped with the p-type impurity in a lower concentration than thereof (e.g. $1 \times 10^{20}$ cm$^{-3}$). The high-concentration p-side contact layer is preferably formed as a thin layer of about 50 to 250 Å in thickness, and with this, deterioration of the crystallinity can be prevented. Also, the thickness of the low-concentration p-side contact layer is preferably set from 100 to 2000 Å. It is preferable that with such structures describe above, while maintaining a thickness necessary for a contact layer, the p-type impurity concentration in the region ohmically contacting with the electrode 21 can be increased.

When the p-side contact layer is formed with the above-described two-layer structure, the p-type impurity concentration in the third p-side nitride semiconductor layer 18 is preferably higher than that in the low-concentration p-side contact layer and lower than the high-concentration p-side contact layer. The low-concentration p-side contact layer is needed to be grown to a certain thickness. Therefore, the p-type impurity concentration therein cannot be raised so much. Therefore, by providing the third p-side nitride semiconductor layer 18 having a higher p-type impurity concentration than that in the low-concentration p-side contact layer, the p-type impurity concentration in the three-layer structure 15 can be controlled in a preferable range and a suitable electric current diffusion effect can be obtained.

Embodiment 2

Figure 3:
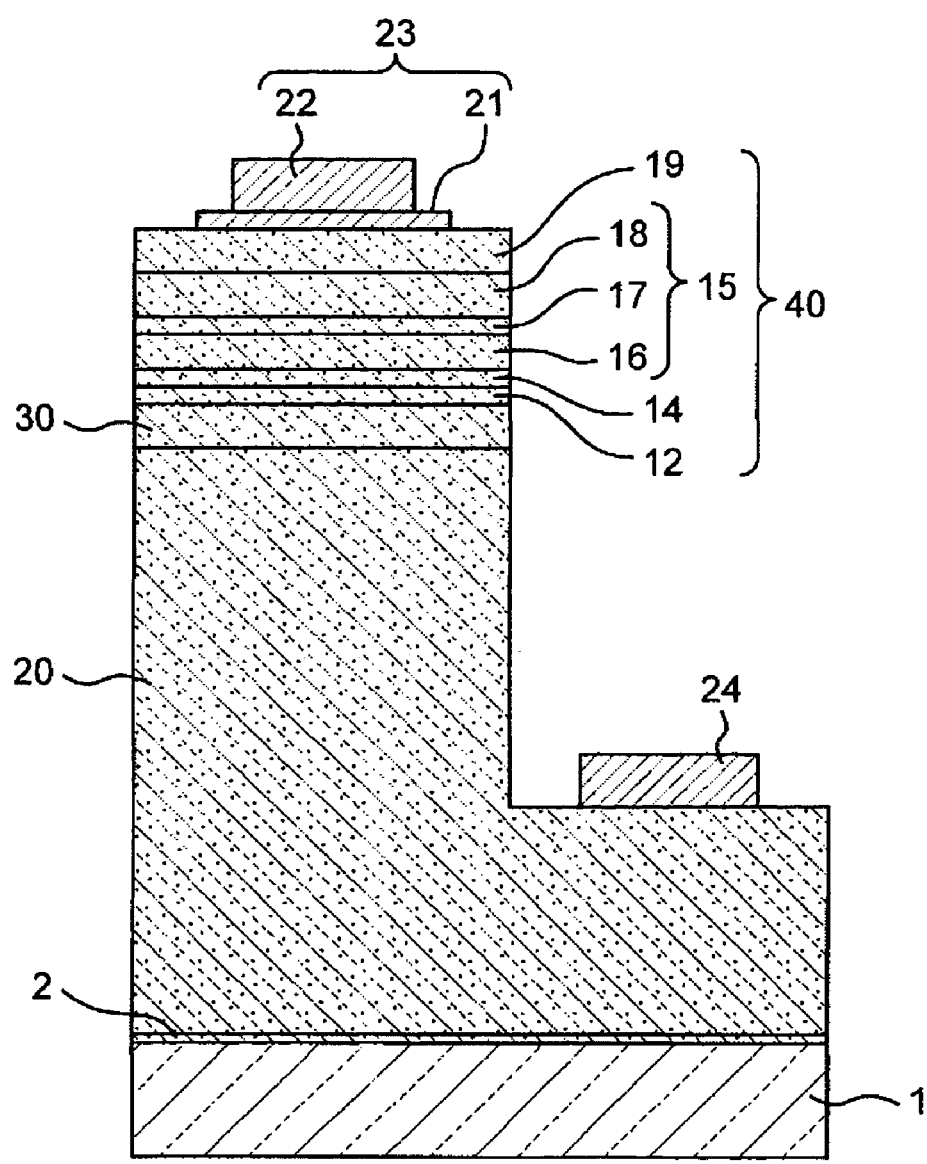
FIG. 3 is a schematic cross-sectional view showing a structure of a nitride semiconductor device according to another example of the present invention.

FIG. 3 is a schematic cross-sectional view showing a nitride semiconductor device according to Embodiment 2. In Embodiment 2, an intermediate layer 14 is provided between the first p-side nitride semiconductor layer 16 and the p-side wide band gap layer 12. Other respects are similar to that shown in Embodiment 1.

The intermediate layer 14 plays such a role as the buffer layer, by preventing the p-type impurity diffused from the wide band gap layer 12 from infiltrating deeply into the nitride semiconductor layer 16. By providing such intermediate layer 14, the p-type impurity concentration in the first p-side nitride semiconductor layer 16 can be reduced and the mobility of the hole accumulation region 25 can further be elevated. Consequently, the p-type impurity concentration in the intermediate layer 14 is adjusted to be at least lower than that in the p-side wide band gap layer 12. The p-type impurity concentration in the intermediate layer 14 is desirably from $5 \times 10^{17}$ to $1 \times 10^{20}$ cm$^{-3}$. Also, the band gap of the intermediate layer 14 is preferably made narrower than the p-side wide band gap layer 12 so as to effectively inject the holes into the active layer. For example, the intermediate layer 14 is preferably made of $In_xGa_{1-x}N$ ($0 \leq x < 1$), more preferably made of AlGaN.

Embodiment 3

Figure 4:
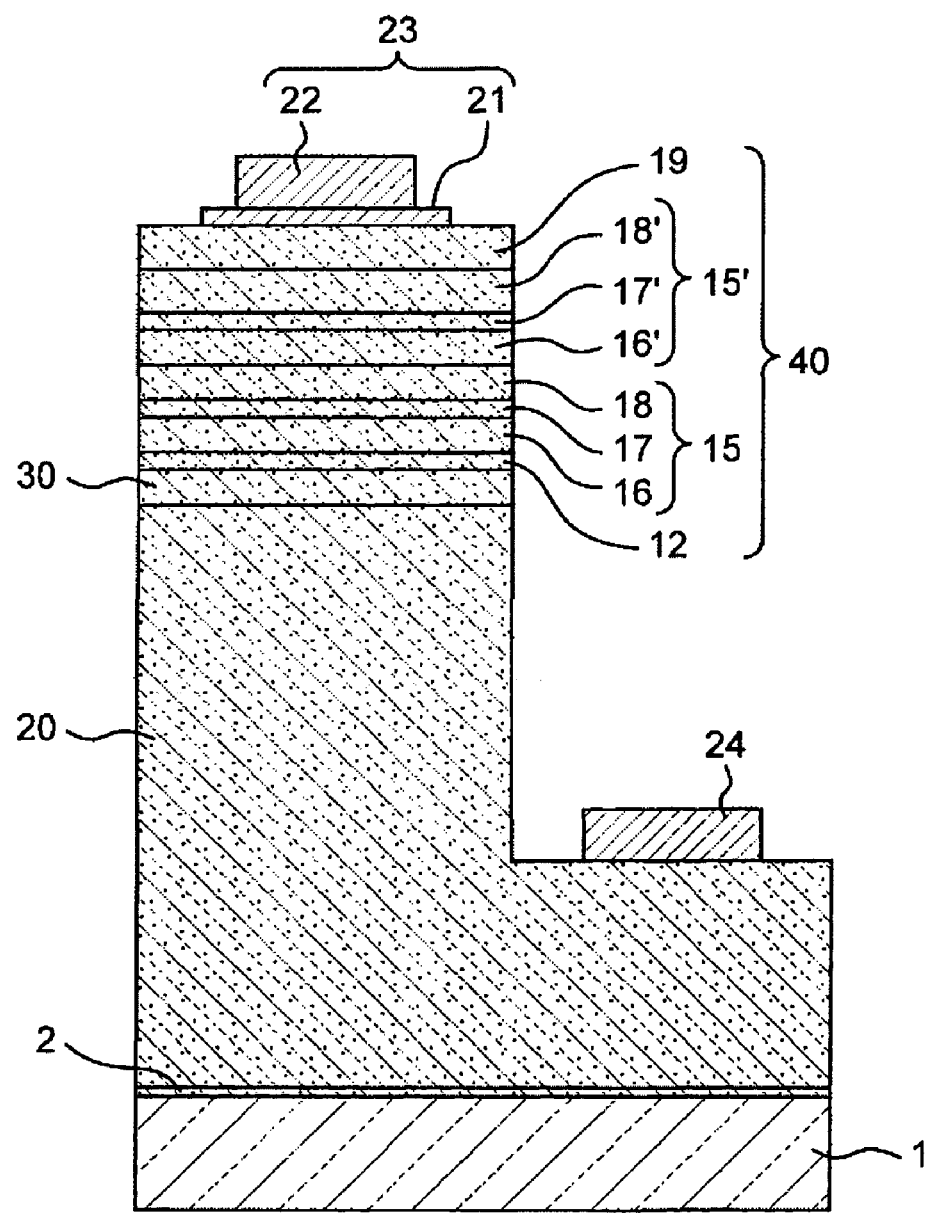
FIG. 4 is a schematic cross-sectional view showing a structure of a nitride semiconductor device according to still another example of the present invention.

FIG. 4 is a schematic cross-sectional view showing a nitride semiconductor device according to Embodiment 3. In Embodiment 3, the three-layer structure is stacked multiple times repeatedly. Other respects are similar to that shown in Embodiment 1. That is, as shown in FIG. 4, after stacking a p-side wide band gap layer 12 on an active layer 30, a first p-side nitride semiconductor layer 16, a second p-side nitride semiconductor layer 17, and a third p-side nitride semiconductor layer 18 are stacked as a first set of a three-layer structure 15. Then, the first p-side nitride semiconductor layer 16', the second p-side nitride semiconductor layer 17', and the third p-side nitride semiconductor layer 18' are stacked as a second set of the three-layer structure 15'. After repeating such stacking for a necessary number of times, a p-side contact layer 19 is formed.

As shown in the present embodiment, by stacking the three-layer structure 15 repeatedly, electric current diffusion effect of the three-layer structure 15 becomes further significant. The number of repetition is not specifically limited, but 2 to 100 times is desirable. This is because, although the electric current diffusion effect rises with the number of repetition, the resistance of the entire p-side nitride semiconductor layer 40 becomes large with excessive repetition and problems such as an increase in Vf occur. Moreover, in the cases where the three-layer structure is repeated, if the each layer is too thick, it becomes disadvantageous in the point of crystallinity and ohmic resistance. On the other hand, if the three-layer structure 15 is repeated, the electric current diffusion effect will be accumulated. Therefore, it will be sufficient even when the electric current diffusion effect obtained in each three-layer structure 15 is rather small. Therefore, when the three-layer structure 15 is repeated, it is preferable that the first p-side nitride semiconductor layer 16 is 50 to 375 Å, the second p-side nitride semiconductor layer 17 is 10 to 50 Å, and the third p-side nitride semiconductor layer 18 is 50 to 500 Å. An intermediate layer 14 as described in Embodiment 2 may be formed between the three-layer structures 15. With this construction, diffusion of the p-type impurity from the third p-side nitride semiconductor layer 18 to the first p-side nitride semiconductor layer 16' stacked thereon can be prevented. Also, when the three-layer structures 15 are stacked repeatedly, the first p-side nitride semiconductor layer 16, the second p-side nitride semiconductor layer 17, and the third p-side nitride semiconductor layer 18 can be respectively made with a suitable composition according to each function. However, among the three-layer structures 15, it is preferable that the compositions in the first p-side nitride semiconductor layers 16, the second p-side nitride semiconductor layers 17, and the third p-side nitride semiconductors 18 are respectively the same in each kind of layers.

In above-mentioned Embodiments 1 to 3, a semi-insulating layer may be partially stacked on the n-side nitride semiconductor layer 20 and the p-side nitride semiconductor layer 40. In addition, in a buried layer of reverse conducting type such as a current inhibition layer, a parasitic part of device may be formed partially in the layers of each type of conductivity.

In Embodiments 1 to 3, examples in which an n-type nitride semiconductor layer 20, and active layer 30, and a p-side nitride semiconductor layer 40 are stacked in sequence on an insulating substrate 1, and a p-side electrode 23 and an n-side electrode 24 are disposed on the same side of the substrate 1, are described. However, the present invention is not limited to the above Embodiments. For example, after stacking an n-side nitride semiconductor layer 20, an active layer 30, and a p-side nitride semiconductor layer 40 in sequence on an insulating substrate 1, a supporting substrate may be connected to the upper surface of the p-side nitride semiconductor layer 40, and after removing the insulating substrate 1, the n-side electrode and the p-side electrode may be disposed on upper and lower sides of the device. Even in such a structure, the effect of improving the ESD tolerance created by the three-layer structure of the present invention can be similarly obtained.

EXAMPLES

The invention will be understood in detail with reference to the following examples. However, the present invention is not construed to be limited by the examples shown below.

Example 1

Figure 5:
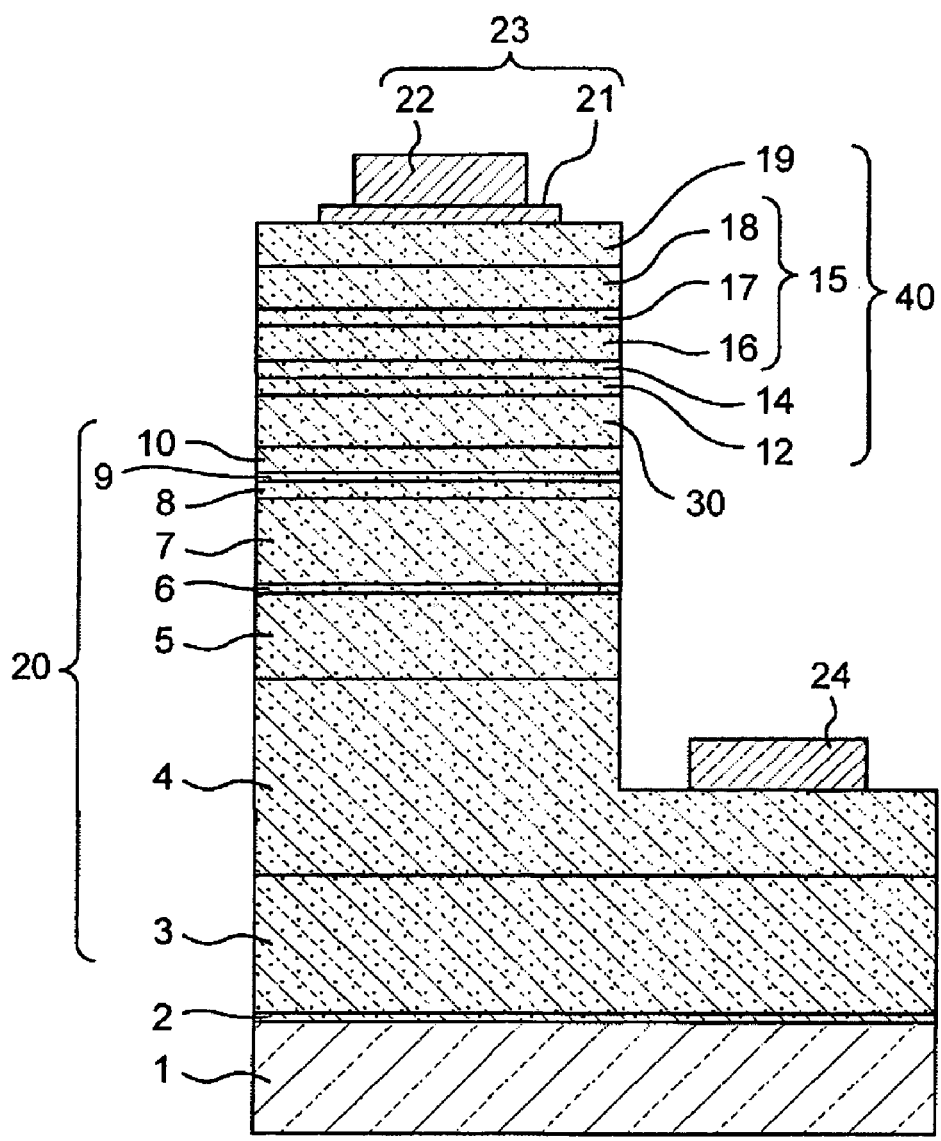
FIG. 5 is a schematic sectional view showing a structure of a nitride semiconductor device according to Example 1 of the present invention.

Example 1 will be described below with reference to FIG. 5.

(Substrate 1)

A substrate 1 made of sapphire (C-plane) is set in a MOVPE reaction vessel. Then, under a flow of hydrogen, the temperature of the substrate is raised to 1050° C. to clean the substrate.

(Buffer Layer 2)

Subsequently, the temperature of the substrate is reduced to 510° C. and by using hydrogen as a carrier gas, ammonia and TMG (trimethylgallium) as a row material gas, a buffer layer 2 made of GaN is grown to a thickness of about 100 angstroms.

(Underlayer 3)

After the buffer layer 2 is grown, only TMG is stopped and the temperature is raised to 1050° C. Next, at a temperature of 1050° C., by using TMG and ammonia gas as the row material gas, an underlayer 3 of undoped GaN layer is grown to a thickness of about 1.5 μm.

(N-type Contact Layer 4)

An n-side contact layer of GaN doped with $5\times10^{18}/cm^3$ of Si is grown to a thickness of about 4 μm at a temperature of 1,050° C. using TMG and ammonia gas as a raw material gas and silane gas as an impurity gas.

(First N-side Layer 5)

Then at 1050° C., only the silane gas is stopped and a second n-side layer 5 of undoped GaN layer is grown to a thickness of about 1500 angstroms.

(Second N-side Layer 6)

Then at 1050° C., using the silane gas, a second n-side layer 6 of GaN layer doped with $5\times10^{17}/cm^3$ of Si is grown to a thickness of about 100 angstroms.

(Third N-side Layer 7)

Then at 1050° C., only the silane gas is stopped and a third n-side layer 7 of undoped GaN layer is grown to a thickness of about 1500 angstroms.

(Fourth N-side Layer 8)

Then at 1050° C., using the silane gas, a fourth n-side layer 8 of GaN layer doped with $1\times10^{19}/cm^3$ of Si is grown to a thickness of about 300 angstroms.

(Fifth N-side Layer 9)

Then at 1050° C., using TMG and ammonia, a fifth n-side layer 9 of undoped GaN layer is grown to a thickness of about 50 angstroms.

The fifth n-side layer 9 is preferably made of AlGaN with the Al ratio of 0.2 or less, or InGaN with the In ratio of 0.1 or less, more preferably made of GaN. The first n-side layer 5 through the fifth n-side layer 9 may have different compositions each other, however, it is preferable that the layers have the same composition, more preferably, the layers are made of GaN.

The n-type impurity concentration in the fifth n-side layer 9 may be $1\times10^{18}/cm^3$ or less, preferably $5\times10^{17}/cm^3$ or less, more preferably $1\times10^{17}/cm^3$ or less. Here, in each range of the n-type impurity concentration described above also includes undoped. With this arrangement, especially, the less the n-type impurity concentration becomes (the closer the n-type impurity concentration approaches to undoped), the effect described above becomes more significant. The n-type impurity concentration in the second n-side layer 6 and the fourth n-side layer 8 may be higher than that in the fifth n-side layer 9. With this arrangement, the effect described above can be obtained more effectively.

The thickness of the fifth n-side layer 9 may be 10 to 1000 angstroms, preferably 15 to 500 angstroms, more preferably 25 to 150 angstroms, further preferably 30 to 80 angstroms. When the thickness of the fifth n-side layer 9 is less than 10 angstroms, the ESD tolerance tends to decrease. On the contrary, when the thickness of the fifth n-side layer 9 is greater than 1000 angstroms, there is a tendency in which not only the Vf increases, but also the ESD tolerance decreases.

(N-side Multilayer 10 having Superlattice Structure)

By using TMG and ammonia, an undoped GaN layer is grown to a thickness of about 35 angstroms, then, the temperature is lowered, and by using TMG, TMI, and ammonia, a first nitride semiconductor layer made of an undoped $In_{0.03}Ga_{0.97}N$ is grown thereon to a thickness of about 15 angstroms. The steps described above are repeated so as to alternately stack each 10 layers thereof, and finally, an undoped GaN layer is grown to a thickness of about 35 angstroms to form an n-type multilayer with a superlattice structure.

The n-type multilayer 10 is only needed to be made of at least two nitride semiconductors having different compositions. Examples of two preferable compositions thereof include AlGaN (including GaN) with Al ratio of 0.1 or less, and InGaN with In ratio of 0.1 or less.

The thickness of a single layer which is a constituent of the n-side multilayer 10 having a superlattice structure is not specifically limited. The thickness may be 100 angstroms or less, preferably 70 angstroms or less, and more preferably 50 angstroms or less. With this, the output power tends to increase. The single layers constructing the n-side multilayer 10 having a superlattice structure may respectively be either undoped or doped with an n-type impurity. However, it is preferable that the all layers are undoped.

Here, the n-side multilayer 10 having a superlattice structure is used between the fifth n-side layer 9 and the active layer 30, however, a thick single layer with a thickness of 100 angstroms or more may be provided instead of the n-side multilayer 10 having a superlattice structure.

(Active Layer 30)

A barrier layer made of undoped GaN is grown to a thickness of 200 angstroms and subsequently, at the temperature of 800° C., a well layer made of undoped $In_{0.3}Ga_{0.7}N$ is grown to a thickness of 20 angstroms by using TMG, TMI, and ammonia. Then, in the order of a barrier layer, a well layer, a barrier layer, a well layer, ..., and a barrier layer, five barrier layers and four well layers are stacked alternately to form an active layer 30 having a multiquantum well structure with a total thickness of 1080 angstroms.

(P-side Wide Band Gap Multilayer 12 having Superlattice Structure)

By using TMG, TMA, ammonia, $Cp_2Mg$ (bis-cyclopentadienylmagnesium), a layer of $Al_{0.15}Ga_{0.85}N$ doped with Mg of $5\times10^{19}/cm^3$ is grown to a thickness of about 35 angstroms. Then, subsequently, TMA is stopped, and instead, by using TMI, a layer made of $In_{0.03}Ga_{0.97}N$ doped with Mg of $5\times10^{19}/cm^3$ is grown to a thickness of about 20 angstroms. The above-described operations are repeated to stack each five layers, and finally, a layer of $Al_{0.15}Ga_{0.85}N$ doped with Mg of $5\times10^{19}/cm^3$ is grown to a thickness of about 35 angstroms to form a p-side multilayer 12 having a superlattice structure.

The p-side wide bang gap multilayer 12 is only needed to be made of at least two kinds of the nitride semiconductors having different compositions. Examples of two preferable compositions thereof include AlGaN with the Al ratio of 0.2 or less, and InGaN (including GaN) with the In ratio of 0.1 or less. The thickness of each layer which is a constituent of the p-side wide band gap multilayer 12 having a superlattice structure is not specifically limited, however, the thickness may be 100 angstroms or less, preferably 70 angstroms or less, and more preferably 50 angstroms or less. With this, the output power tends to increase.

(Intermediate Layer 14)

At 1050° C., using TMG and ammonia, an intermediate layer 14 of undoped GaN layer is grown to a thickness of about 1000 angstroms.

(First P-side Nitride Semiconductor Layer 16)

Thereon, by using TMG, TMI and ammonia, a first p-side nitride semiconductor layer 16 of undoped $In_{0.08}Ga_{0.92}N$ is grown to a thickness of about 450 angstroms.

(Second P-side Nitride Semiconductor Layer 17)

By using TMG and ammonia, a second p-side nitride semiconductor layer 17 of undoped GaN layer is grown to a thickness of about 40 angstroms.

(Third P-side Nitride Semiconductor Layer 18)

By using TMG, ammonia, and $Cp_2Mg$ (bis-cyclopentadienylmagnesium), a third p-side nitride semiconductor layer 18 of GaN layer doped with Mg of $5\times10^{20}/cm^3$ is grown to a thickness of about 450 angstroms.

(P-side Contact Layer 19)

At 1050° C. and by using TMG, ammonia, and $Cp_2Mg$, a p-side contact layer 19 made of p-type GaN doped with Mg of $1\times10^{20}/cm^3$ is grown to a thickness of 1000 angstroms.

After the reaction is completed, the temperature is lowered to room temperature. Then, a wafer is placed in a reaction vessel and in a nitrogen atmosphere, annealing is carried out at 700° C. to further reduce the resistance of the p-side layer. After annealing, the wafer is taken out from the reaction vessel, and a mask with a pre-determined shape is disposed on the surface of the p-type contact layer 19 which is the top layer. Then, by using RIE (Reactive Ion Etching) apparatus, etching is carried out from the p-side contact layer 19 side to expose the surface of the n-side contact layer 4 as shown in FIG. 5.

After etching, a transparent p-side ohmic electrode 21 made of ITO is disposed on the approximately entire surface of the p-side contact layer 19 locating the top, and a p-side pad electrode 22 for bonding and including W, Pt, and Au is disposed thereon to form a p-side electrode 23. On the other hand, an n-side electrode 24 is disposed on the surface of the n-side contact layer 4 exposed by the etching, by using the same material and in the same process as the p-side pad electrode 22.

The LEDs finally obtained by dividing the wafer into individual chips exhibited an average breakdown voltage of about 1800 V according to a measurement of ESD tolerance. In addition, the optical output was 15.7 mW.

Comparative Example 1

The nitride semiconductor device is fabricated in the same manner as in Example 1, except that the intermediate layer 14, the first p-side nitride semiconductor layer 16, the second p-side nitride semiconductor layer 17, and the third p-side nitride semiconductor layer 18 are not formed. The obtained LED exhibited an average breakdown voltage of about 1400 V according to a measurement of the ESD tolerance. In addition, the optical output was 14.4 mW.

Example 2

The nitride semiconductor device is fabricated in the same manner as in Example 1, except that the p-side contact layer 19 is omitted and the thickness of the third p-side nitride semiconductor layer 18 is set to 1500 Å. The obtained LED exhibits average breakdown voltage of about 1600 V according to a measurement of the ESD tolerance, and the optical output of 15.0 mW.

Example 3

The nitride semiconductor device is fabricated in the same manner as in Example 1, except that the p-side contact layer 19 is made with a two-layer structure of a low-concentration p-side contact layer and a high-concentration p-side contact layer. The low-concentration p-side contact layer is made of GaN with the Mg concentration of $1\times10^{20}$ cm$^{-3}$ and about 1125 Å, and the high-concentration p-side contact layer is made of GaN with the Mg concentration of $1.5\times10^{21}$ cm$^{-3}$ and about 100 Å. The obtained LED exhibited a somewhat lower Vf and a similar ESD tolerance and optical output as shown in Example 1.

Example 4

The nitride semiconductor device is fabricated in the same manner as in Example 1, except that growing of the first p-side nitride semiconductor layer 16, the second p-side nitride semiconductor layer 17, and the third p-side nitride semiconductor layer 18 are repeated five times.

The LED thus obtained exhibits approximately the same properties as in Example 1.

Example 5

The nitride semiconductor device is fabricated in the same manner as in Example 1, except that a layer made of undoped AlGaN is formed with a thickness of 180 angstroms as a low impurity concentration layer between the underlayer 3 and the n-type contact layer 4. The obtained LED exhibits better ESD tolerance at the n-side than that in Example 1, and exhibits approximately the same results for the other properties as in Example 1.

Example 6

The nitride semiconductor device is fabricated in the same manner as in Example 1, except that a layer made of undoped AlGaN with a thickness of 180 angstroms and a layer made of Si-doped AlGaN with a thickness of 360 angstroms are formed in order as a low impurity concentration layer between the underlayer 3 and the n-type contact layer 4. The obtained LED exhibits approximately the same properties as the device obtained in Example 5.

INDUSTRIAL APPLICABILITY

The nitride semiconductor devices according to the present invention can be used suitably as the light emitting elements, in the light emitting devices constructing various light sources for backlights, displays, lightings, lamps for vehicles, and the like, and further they can be applied not only for the light emitting diodes but also for the nitride semiconductor laser devices. Moreover, the nitride semiconductor devices of the present invention can be applied not only to the light emitting devices but also to other nitride semiconductor devices such as photodetectors.

What is claimed is:

1. A nitride semiconductor device comprising:
   an active layer made of a nitride semiconductor and placed between an n-side nitride semiconductor layer and a p-side nitride semiconductor layer, and
   an n-side electrode disposed on the n-side nitride semiconductor layer and a p-side electrode disposed on the p-side nitride semiconductor layer,
   wherein the p-side nitride semiconductor layer comprises, from the active layer side, a p-side wide band gap layer made of a nitride semiconductor having a wider band gap than that of the active layer and containing a p-type impurity, and
   a three layer structure comprising a first p-side nitride semiconductor layer, a second p-side nitride semiconductor layer and a third p-side nitride semiconductor layer,
   wherein the third p-side nitride semiconductor layer contains a p-type impurity in a concentration of $5\times10^{20}$ to $2\times10^{21}$ cm$^{-3}$,
   the second p-side nitride semiconductor layer contains a p-type impurity in a lower concentration than that of the third p-side nitride semiconductor layer, and
   the first p-side nitride semiconductor layer has a narrower band gap than that of the second p-side nitride semiconductor layer, and has a lower p-type impurity concentration in the vicinity of the interface with the second p-side nitride semiconductor layer than a p-type impurity concentration of the second p-side nitride semiconductor layer.

2. The nitride semiconductor device according to claim 1, wherein the first p-side nitride semiconductor layer has a thickness ranging from 50 to 1000 Å.

3. The nitride semiconductor device according to claim 1, wherein the second p-side nitride semiconductor layer has a thickness ranging from 10 to 200 Å.

4. The nitride semiconductor device according to claim 1, wherein the third p-side nitride semiconductor layer has a thickness ranging from 50 to 1000 Å.

5. The nitride semiconductor device according to claim 1, wherein, in the first p-side nitride semiconductor layer, the p-type impurity concentration in the vicinity of the interface with the second p-side nitride semiconductor layer is $1\times10^{18}$ cm$^{-3}$ or less.

6. The nitride semiconductor device according to claim 1, wherein the average p-type impurity concentration in the second p-side nitride semiconductor layer is $1\times10^{17}$ to $2\times10^{19}$ cm$^{-3}$.

7. The nitride semiconductor device according to claim 1, wherein the first p-side nitride semiconductor layer includes $In_xGa_{1-x}N$ ($0<x\leq1$) and the second p-side nitride semiconductor layer includes $In_yGa_{1-y}N$ ($0\leq y<1$, $y<x$).

8. The nitride semiconductor device according to claim 1, wherein the first p-side nitride semiconductor layer includes GaN and the second p-side nitride semiconductor layer includes AlGaN.

9. The nitride semiconductor device according to claim 1, wherein the third p-side nitride semiconductor layer includes GaN.

10. The nitride semiconductor device according to claim 1, further comprising an intermediate layer between the p-side wide band gap layer and the first p-side nitride semiconductor layer, the intermediate layer being made of a nitride semiconductor having a lower p-type impurity concentration than that in the p-side wide band gap layer.

11. The nitride semiconductor device according to claim 10, wherein the intermediate layer includes $In_xGa_{1-x}N$ ($0\leq x<1$).

12. The nitride semiconductor device according to claim 1, wherein the three-layer structure is repeatedly stacked.

13. The nitride semiconductor device according to claim 1, wherein the p-side electrode is disposed on the third p-side nitride semiconductor layer.

14. The nitride semiconductor device according to claim 1, wherein the n-side nitride semiconductor layer comprises a n-type contact layer for forming the n-side electrode, a low impurity concentration layer provided adjacent to a surface of the n-type contact layer that is opposite from the active layer, and a layer provided in contact with the low impurity concentration layer without doping and having a smaller band gap than that of the low impurity concentration layer.

15. The nitride semiconductor device according to claim 14, wherein the low impurity concentration layer is made of $Al_aGa_{1-a}N$ ($0 \leq a \leq 1$).

16. The nitride semiconductor device according to claim 1, further comprising a substrate having a plurality of recesses and protrusions, a buffer layer formed on the substrate, and an underlayer formed on the buffer layer, wherein the n-side nitride semiconductor layer is formed on the underlayer.

17. The nitride semiconductor device according to claim 1, wherein the first p-side nitride semiconductor layer has a pit of a band gap in the valence band, where holes are accumulated, in the vicinity of the interface with the second p-side nitride semiconductor layer.

* * * * *